US011985469B2

(12) United States Patent
Goh et al.

(10) Patent No.: US 11,985,469 B2
(45) Date of Patent: May 14, 2024

(54) SYSTEM AND METHOD FOR ENHANCED WEARABLE HEARING DEVICE COMMAND INSTRUCTION MANUAL INPUT

(71) Applicant: Dell Products, LP, Round Rock, TX (US)

(72) Inventors: Peng Lip Goh, Singapore (SG); Sok Hui Khoo, Singapore (SG); Suet Chan Law, Singapore (SG)

(73) Assignee: DELL PRODUCTS LP, Round Rock, TX (US)

( * ) Notice: Subject to any disclaimer, the term of this patent is extended or adjusted under 35 U.S.C. 154(b) by 194 days.

(21) Appl. No.: 17/733,145

(22) Filed: Apr. 29, 2022

(65) Prior Publication Data

US 2023/0353923 A1    Nov. 2, 2023

(51) Int. Cl.
 *H04R 1/10* (2006.01)
 *G01D 5/14* (2006.01)
 *H03K 17/972* (2006.01)

(52) U.S. Cl.
 CPC .......... *H04R 1/1041* (2013.01); *G01D 5/145* (2013.01); *H03K 17/972* (2013.01); *H04R 1/1016* (2013.01)

(58) Field of Classification Search
 CPC .. H04R 1/1016; H04R 1/1041; H04R 25/603; H04R 25/609; H04R 2225/61

USPC .......................................... 381/109, 74, 123
See application file for complete search history.

(56) References Cited

U.S. PATENT DOCUMENTS

| | | | |
|---|---|---|---|
| 8,331,603 B2 * | 12/2012 | Martenson | H04R 1/08 381/74 |
| 11,330,354 B2 * | 5/2022 | Degner | H04R 1/1041 |
| 11,599,146 B2 * | 3/2023 | Olafsson | G06F 21/36 |

* cited by examiner

*Primary Examiner* — Disler Paul
(74) *Attorney, Agent, or Firm* — Prol Intellectual Property Law, PLLC; H. Kenneth Prol

(57) ABSTRACT

A wearable hearing device operatively coupled to an information handling system comprising a housing for a speaker and a microphone, a magnetic slider switch moveable with respect to the housing between a closed position and an open position in response to a user's external force, a rolling magnet rotating within the magnetic slider switch during movement between the open and closed positions, a bar magnet fixed within the housing having a first pole attracting the rolling magnet in the closed position and a second pole attracting the rolling magnet in the open position to reduce the external force required to move the magnetic slider switch, a hall effect sensor to sense a change in distance to the rolling magnet during movement between the open and closed positions, and to associate the change in distance with a command instruction, and a microcontroller to execute or transmit the command instruction.

20 Claims, 15 Drawing Sheets

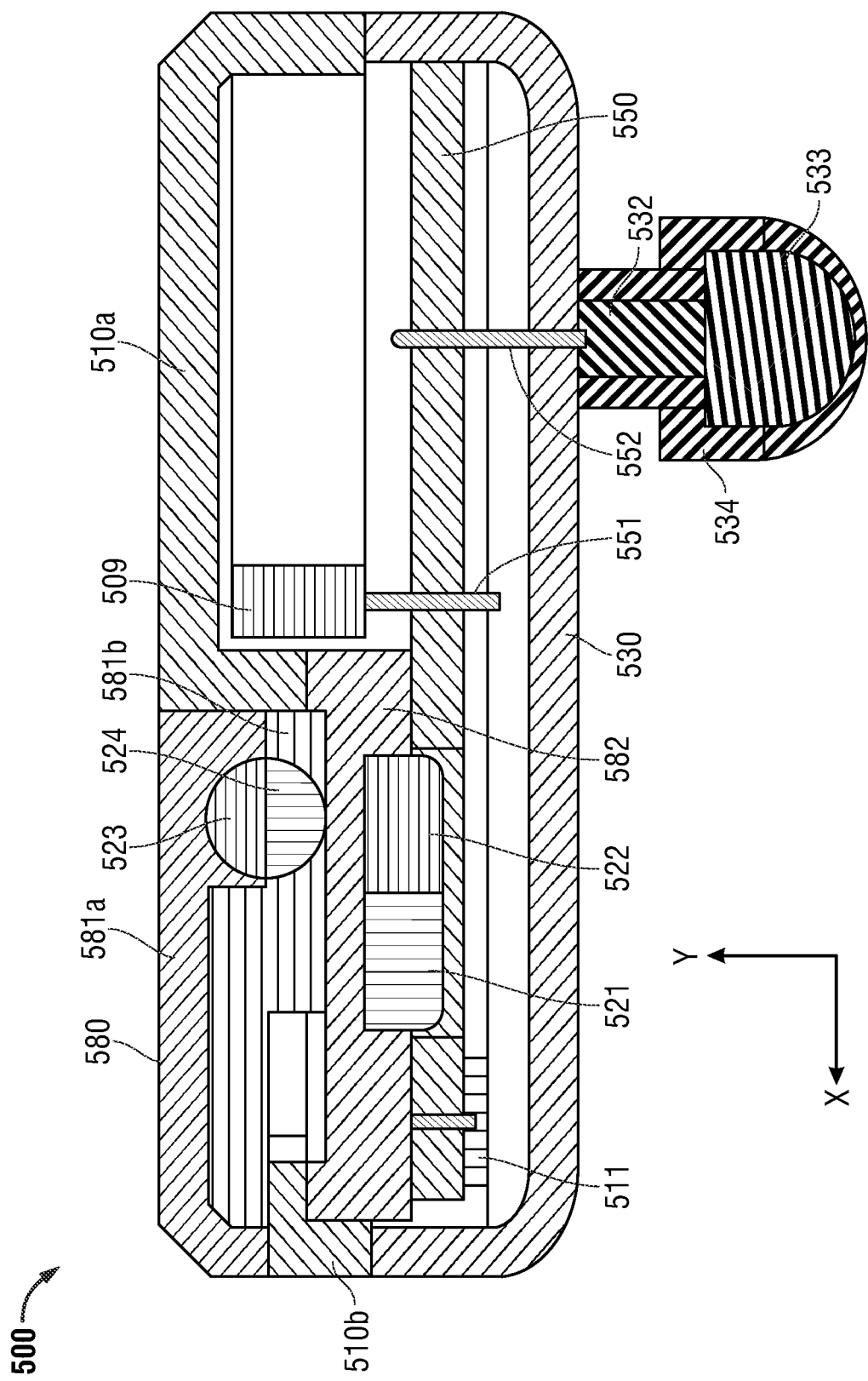

SYSTEM AND METHOD FOR ENHANCED WEARABLE HEARING DEVICE COMMAND INSTRUCTION MANUAL INPUT

FIELD OF THE DISCLOSURE

The present disclosure generally relates to wireless wearable hearing devices, such as earbuds and headphones. More specifically, the present disclosure relates to a system for receiving user command instructions via manual manipulation of the wearable hearing device by a single hand of the user/wearer without displacement of wearable hearing device from the user's ear.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling may vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, video communication capabilities, and audio capabilities. The information handling system may be operatively couple to one or more peripheral input/output devices such as a keyboard, mouse, touchpad, display device, wearable peripheral device, touchpad, speakers, earbud, headphone, microphone, or other peripheral devices.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which:

FIG. 5A is a graphical diagram illustrating a cutaway view of a wearable hearing device magnetic slider switch in a closed configuration according to a first embodiment of the present disclosure;

The use of the same reference symbols in different drawings may indicate similar or identical items.

DETAILED DESCRIPTION OF THE DRAWINGS

Figure 1:
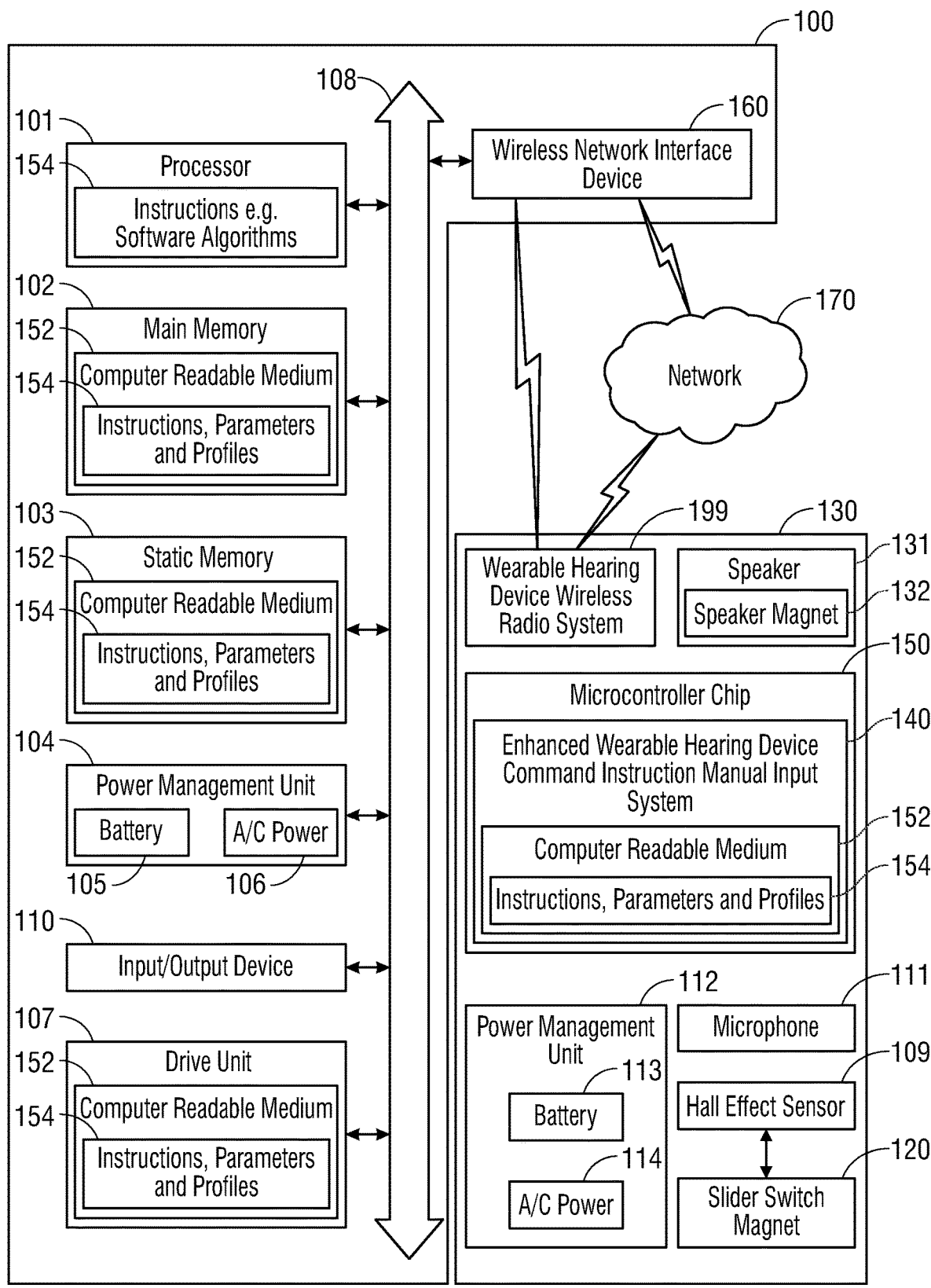
FIG. 1 is a block diagram illustrating an information handling system including a wearable hearing device according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

User experience for users of wireless wearable hearing devices, such as a wearable earbud device or a headset device is dependent upon the ability of the user to provide certain user inputs or commands via the wearable hearing device, such as an earbud or an earphone, without displacing the wearable hearing device from the user's ear or ear canal. For example, wireless wearable hearing device user experience may be negatively impacted by difficulty answering, muting, or terminating a call in which the user is participating via the wearable hearing device, or difficulty increasing or decreasing volume or skipping forward or backward within streaming audio output by the wearable hearing device.

In addition to the need for reliable user command input mechanisms, user experience may also hinge upon reliable confirmation that the user command has been received by the wearable hearing devices. For example, users may prefer wearable hearing devices that provide some form of confirmation that a call has been answered, muted, or terminated. Previous systems have provided such confirmation via audio feedback such as a chime or voice notification. Not only do these audio feedback methods interfere with any audio concurrently being output by the wearable headset device speaker (e.g., a currently executing call or streaming audio), these audio feedback methods often only notify the user of the current setting (e.g., call answered, call muted, call terminated) once. In other words, the user may have no way of checking to ensure the current setting without referring to a visual or graphical user interface of a wireless mobile device paired to the wearable hearing device.

Other previous systems may employ a physical switch of some type to receive user input via the wearable headset device. Such physical switches may provide tactile feedback of a current setting by associating the physical position of the switch within some type of housing, which can be felt by the user, with a known user input. These types of physical switches are particularly popular in wearable headset devices that have a wired connection to a mobile computing device (e.g., smart phone), where the physical switch may be located on a housing attached to the wire, rather than incorporated within the wearable portion of the wearable hearing device located in or around the user's ear. In order to provide such tactile feedback within a wireless wearable hearing device, such a physical switch may need to be incorporated within the wearable portion of the device located in or around the user's ear (e.g., earbud or earphone). However, market trends toward smaller and more lightweight wireless hearing devices (e.g., earbuds and earphones) complicates incorporation of such a physical switch within the wearable portion of the device located in or around the user's ear. Because these devices are small and lightweight, the force required to manipulate such a switch (e.g., via the user's fingers) may inadvertently displace the wearable hearing device from its intended position in or around the user's ear. A solution is needed that provides a physical switch that can be manipulated by the user without displacing the wearable hearing device from its intended position, for tactile feedback of a current setting for the wearable hearing device.

The enhanced wearable hearing device command instruction manual input system of embodiments of the present disclosure addresses these issues by providing a magnetic slider switch within an exterior surface of a wearable hearing device housing that decreases the amount of force the user must exert on the magnetic slider switch to move the magnetic slider switch from one physical switch location to another. The change in position of the magnetic slider switch in embodiments described herein may be easily distinguished by the user through touch, in order to provide continuing tactile feedback indicating a current operational setting (e.g., call or microphone muted) for the wearable hearing device. In such a way, the enhanced wearable hearing device command instruction manual input system may provide a physical switch that can be manipulated by the user without displacing the wearable hearing device from its intended position, for tactile feedback of a current setting for the wearable hearing device.

FIG. 1 illustrates an information handling system 100 according to several aspects of the present disclosure. In the embodiments described herein, an information handling system 100 includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 may be a personal computer, mobile device (e.g., personal digital assistant (PDA) or smart phone), a server (e.g., blade server or rack server), a wired or wireless docking station for a mobile computing device, a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a tablet computer, a desktop computer, an augmented reality system, a virtual reality system, a communications device, an access point (AP), a base station transceiver, a wireless telephone, a control system, a camera, a scanner, a printer, a personal trusted device, a web appliance, or any other suitable machine capable of executing a set of instructions (sequential or otherwise) that specify actions to be taken by that machine, and may vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the information handling system 100 may be implemented using electronic devices that provide voice, video or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or multiple sets, of instructions to perform one or more computer functions.

The information handling system 100 in an embodiment is operably coupled to a wearable hearing device 130 a user may position in or around the user's ears in order to wirelessly receive and transmit audio data, such as a voice call or streaming audio content (e.g., podcast, music, etc.) via a link with between the wireless network interface device 160 the paired wearable hearing device wireless system 199. Information handling system 100 may be any information handling system, such as a smart phone, tablet, or laptop, used with a wearable hearing device 130. Such a wearable hearing device 130 in an embodiment may house a microphone 111 for recording a user's voice and a speaker 131131 for outputting or playing audio data received from the information handling system 100 or the network 170 via the wearable hearing device wireless system 199. In an embodiment, the wearable hearing device 130 may include a microcontroller chip 150 that may be any device or devices that execute instructions, parameters, and profiles 154 of an enhanced wearable hearing device command instruction manual input system 140 to associate a physical position of a slider switch magnet 120 with respect to a hall effect sensor 109 with a user input command instruction executable by the microcontroller chip 150 or the processor 101 on a paired information handling system 100.

The information handling system 100 may include a memory 102, (with computer readable medium 152 that is volatile (e.g. random-access memory, etc.), nonvolatile memory (read-only memory, flash memory etc.) or any combination thereof), one or more processing resources, such as a central processing unit (CPU), a graphics processing unit (GPU), a Visual Processing Unit (VPU) or a Hardware Accelerator, any one of which may be the processor 101 illustrated in FIG. 1, hardware or software control logic, or any combination thereof. Additional components of the information handling system 100 may include one or more storage devices 103 or 107, a wireless network interface device 160, one or more communications ports for communicating with external devices, as well as various input and output (I/O) devices 110, such as a keyboard, a mouse, touchpad or any combination thereof. A power management unit 104 supplying power to the information handling system 100, via a battery 105 or an alternating current (A/C) power adapter 106 may supply power to one or more components of the information handling system 100, including the processor 101, the wireless network interface device 160, a static memory 103 or drive unit 107 or other components of an information handling system. A similar power management unit 112 with a battery 113 or A/C power charging adapter 114 may also be on the wearable hearing device 130 to provide power to the microcontroller chip 150, the hall effect sensor 109, the speaker 131, the microphone 111, or other components of the wearable hearing device 130. The microphone 111 in an embodiment may operate to record a user's voice, and the speaker 131 may operate to output audio played by the wearable headset device, such as an incoming call or streaming audio received via the network interface device 160 or the paired mobile computing device 199. The speaker 131 in an embodiment may comprise a speaker magnet 132 that is separate from the slider switch magnet 120, or the slider switch magnet 120 may incorporate some portion of the speaker magnet 132. In an embodiment, the slider switch magnet 120 is a fixed bar magnet housed within a wearable hearing device housing as described in greater detail herein. The information handling system 100 may also include one or more buses (e.g., 108) operable to transmit communications between the various hardware components. Portions of an information handling system 100 may themselves be considered information handling systems 100 in the embodiments presented herein.

The hall effect sensor 109 may operate to sense a change in distance between the hall effect sensor 109 and a rounded magnet 120 housed within a magnetic slider switch of the wearable headset device 100 when lateral movement occurs to shift the magnetic slider switch from a closed configuration to an open configuration or vice versa, as described in greater detail below. The hall effect sensor 109 may transmit an indication that such movement has occurred to the processor 101 or embedded chip. The command instruction and an association between that command instruction and one or more known configurations of the magnetic slider switch in an embodiment may be stored in memory of the wearable hearing device 100. For example, various command instructions and their associated magnetic slider switch configurations may be preset and stored in computer readable medium 152 within the microcontroller chip 150, main memory 102, static memory 103, or drive unit 107. Such instructions may be stored as software or firmware in various embodiments described herein. Command instructions that may be associated with a particular configuration of the magnetic slider switch in an embodiment may include, for example, a command to mute a current call, to answer a current call, to end a current call, to increase or decrease volume, to initiate a voice assistance program (e.g., Siri®), to fast forward playback of an audio file or streaming audio (e.g., by ten seconds or thirty seconds), or to rewind playback of an audio file or streaming audio (e.g., by ten seconds or thirty seconds).

The processor 101 or the microcontroller chip 150 in an embodiment may receive an indication of a change in distance between the hall effect sensor 109 and a rounded magnet 120 housed within the magnetic slider switch, and associate that change in distance with a known configuration of the magnetic slider switch (e.g., open configuration, closed configuration, intermediate configuration). In an embodiment, the processor 101 or the microcontroller chip 150 may associate such a known configuration with a preset or pre-programmed command instruction (e.g., mute call, or terminate call). Such command instructions in various embodiments described herein may be executable by the processor 101, the microcontroller chip 150, by various other components housed within the wearable hearing device 130, or by various components of the paired mobile information handling system 100. For example, the processor 101 or microcontroller chip 150 in an embodiment may execute an instruction to mute a call by terminating power supply to the microphone 111 or ceasing to receive microphone voice data from the wearable hearing device. In another example embodiment, the processor 101 or microcontroller chip 150 may execute an instruction to terminate a call by transmitting an instruction to the paired information handling system 100 via wearable hearing device wireless system 199 and the wireless network interface device 160 to terminate another wireless link of the wireless network interface device supporting that call between the information handling system 100 and a WLAN or WWAN network (e.g., 170). The information handling system 100 may then execute such an instruction to terminate the call wireless link with an LTE base station or Wi-Fi access point, thus ending the call. The wireless network interface device 160 in an embodiment may be capable of communication between the information handling system and network 170 (e.g., LAN, WLAN, WAN, WLAN) in some embodiments. Further, wireless network interface device 160 may be capable of communication with the paired wearable hearing device 130 using a wireless link established using Near Field Communication (NFC), or Bluetooth® technology, for example.

Information handling system 100 may include devices or modules that embody one or more of the devices or execute instructions for the one or more systems and modules described herein and operates to perform one or more of the methods described herein. The information handling system 100 may execute code instructions 154 that may operate on servers or systems, remote data centers, or on-box in individual client information handling systems 100 according to various embodiments herein. In some embodiments, it is understood any or all portions of code instructions 154 may operate on a plurality of information handling systems 100.

The information handling system 100 may include a processor 101 such as a central processing unit (CPU), a GPU, a Visual Processing Unit (VPU), or a hardware accelerator, embedded controllers (e.g., 150) or control logic or some combination of the same. Any of the processing resources may operate to execute code that is either firmware or software code. Moreover, the information handling system 100 may include memory such as main memory 102, static memory 103, containing computer readable medium 152 storing instructions 154. Instructions 154 may include an enhanced wearable hearing device command instruction manual input system 140, operating system (OS) software, application software, BIOS software, or other software applications or drivers detectable by processor type 101.

The disk drive unit 107 and static memory 103 may also contain space for data storage in a computer readable medium 152. The instructions 154 in an embodiment may reside completely, or at least partially, within the main memory 102, the static memory 103, and/or within the disk drive 107 during execution by the processor 101. The information handling system 100 may also include one or more buses 108 operable to transmit communications between the various hardware components such as any combination of various input and output (I/O) devices 110, or the wireless network interface device 160, or the like.

Information handling system 100 in an embodiment may be in communication via the wireless network interface device 160 with a wearable hearing device 130 such as a wearable earbud hearing device or a wearable headset hearing device, as described in greater detail herein. The information handling system 100 in such an embodiment may operate on wired and wireless links to connect with the network 170 via a network Access Point (AP) or base station, as described in greater detail herein.

The network interface device 160 may provide connectivity of the information handling system 100 to the network 170 via a network AP or base station in an embodiment. The network 170 in some embodiments may be a wired local area network (LAN), a wireless personal area network (WPAN), a wireless Local Area Network (WLAN), such as a public Wi-Fi communication network, a private Wi-Fi communication network, or other non-cellular communication networks. In other embodiments, the network 170 may be a wired wide area network (WAN), a wireless wide area network (WWAN), such as a 4G LTE public network, or a 5G communication network, or other cellular communication networks, including future protocol communication networks such as upcoming 6G protocols under development. Connectivity to any of a plurality of networks 170, one or more APs for those networks, or to a docking station in an embodiment may be via wired or wireless connection. In some aspects of the present disclosure, the network interface device 160 may operate two or more wireless links. In other aspects of the present disclosure, the information handling system 100 may include a plurality of network interface devices, each capable of establishing a separate wireless link to network 170, such that the information handling system 100 may be in communication with network 170 via a plurality of wireless links.

The network interface device 160 may operate in accordance with any cellular wireless data communication standards. To communicate with a wireless local area network, standards including IEEE 802.11 WLAN standards, IEEE 802.15 WPAN standards, or similar wireless standards may be used. Utilization of radiofrequency communication bands according to several example embodiments of the present disclosure may include bands used with the WLAN standards which may operate in both licensed and unlicensed spectrums. For example, WLAN may use frequency bands such as those supported in the 802.11 a/h/j/n/ac/ax including Wi-Fi 6 and Wi-Fi 6e. It is understood that any number of available channels may be available in WLAN under the 2.4 GHz, 5 GHz, or 6 GHz bands which may be shared communication frequency bands with WWAN protocols or Bluetooth® protocols in some embodiments.

The network interface device 160, in other embodiments, may connect to any combination of cellular wireless connections including 2G, 2.5G, 3G, 4G, 5G or the like from one or more service providers or privately administered by an enterprise. Utilization of radiofrequency communication bands according to several example embodiments of the present disclosure may include bands used with the WWAN standards, which may operate in both licensed and unlicensed spectrums. More specifically, the network interface device 160 in an embodiment may transceive within radio frequencies associated with the 5G New Radio (NR) Frequency Range 1 (FR1) or Frequency Range 2 (FR2). NRFR1 may include radio frequencies below 6 GHz, also sometimes associated with 4G LTE and other standards predating the 5G communications standards. NRFR2 may include radio frequencies above 6 GHz, made available within the emerging 5G communications standard. Frequencies related to the 5G networks may include high frequency (HF) band, very high frequency (VHF) band, ultra-high frequency (UHF) band, L band, S band, C band, X band, Ku band, K band, Ka band, V band, W band, and millimeter wave bands.

In some embodiments, software, firmware, dedicated hardware implementations such as application specific integrated circuits, programmable logic arrays and other hardware devices may be constructed to implement one or more of some systems and methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations may include distributed processing, component/object distributed processing, and parallel processing. Alternatively, virtual computer system processing may be constructed to implement one or more of the methods or functionalities as described herein.

The present disclosure contemplates a computer-readable medium that includes instructions, parameters, and profiles 154 or receives and executes instructions, parameters, and profiles 154 responsive to a propagated signal, so that a device connected to a network 170 may communicate voice, video or data over the network 170. Further, the instructions 154 may be transmitted or received over the network 170 via the network interface device 160. The information handling system 100 may include a set of instructions 154 that may be executed to cause the computer system to perform any one or more of the methods or computer-based functions disclosed herein. For example, instructions 154 may include a particular example of an enhanced wearable hearing device command instruction manual input system 140, or other aspects or components. Various software modules comprising application instructions 154 may be coordinated by an operating system (OS), and/or via an application programming interface (API). An example operating system may include Windows®, Android®, and other OS types. Example APIs may include Win 32, Core Java API, or Android APIs. Application instructions 154 may also include any application processing drivers, or the like executing on information handling system 100.

The enhanced wearable hearing device command instruction manual input system 140 on the wearable hearing device 130 may utilize a computer-readable medium 152 in which one or more sets of instructions 154 such as firmware may be embedded with microcontroller chip 150. In other embodiments, the enhanced wearable hearing device command instruction manual input system 140 may operate in part as software or firmware instructions executed on the information handling system 100. The instructions 154 may embody one or more of the methods or logic as described herein. For example, instructions relating to the enhanced wearable hearing device command instruction manual input system 140, firmware or software algorithms, processes, and/or methods may be stored here.

Main memory 102 may contain computer-readable medium (not shown), such as RAM in an example embodiment. An example of main memory 102 includes random access memory (RAM) such as static RAM (SRAM), dynamic RAM (DRAM), non-volatile RAM (NV-RAM), or the like, read only memory (ROM), another type of memory, or a combination thereof. Static memory 103 may contain computer-readable medium (not shown), such as NOR or NAND flash memory in some example embodiments. The instructions, parameters, and profiles 154 of the enhanced wearable hearing device command instruction manual input system 140 may be stored in static memory 103, or the drive unit 107 on a computer-readable medium 152 such as a flash memory or magnetic disk in an example embodiment. While the computer-readable medium is shown to be a single medium, the term "computer-readable medium" includes a single-medium or multiple-media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium may include a solid-state memory such as a memory card or other package that houses one or more non-volatile read-only memories. Further, the computer-readable medium may be a random-access memory or other volatile re-writable memory. Additionally, the computer-readable medium may include a magneto-optical or optical medium, such as a disk or tapes or other storage device to store information received via carrier wave signals such as a signal communicated over a transmission medium. Furthermore, a computer readable medium may store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In some embodiments, dedicated hardware implementations such as application specific integrated circuits, programmable logic arrays and other hardware devices may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

When referred to as a "system", a "device," a "module," a "controller," or the like, the embodiments described herein may be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The system, device, controller, or module may include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module may also include a combination of the foregoing examples of hardware or software. In an embodiment an information handling system 100 may include an integrated circuit or a board-level product having portions thereof that may also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another may communicate directly or indirectly through one or more intermediaries.

Figure 2A:
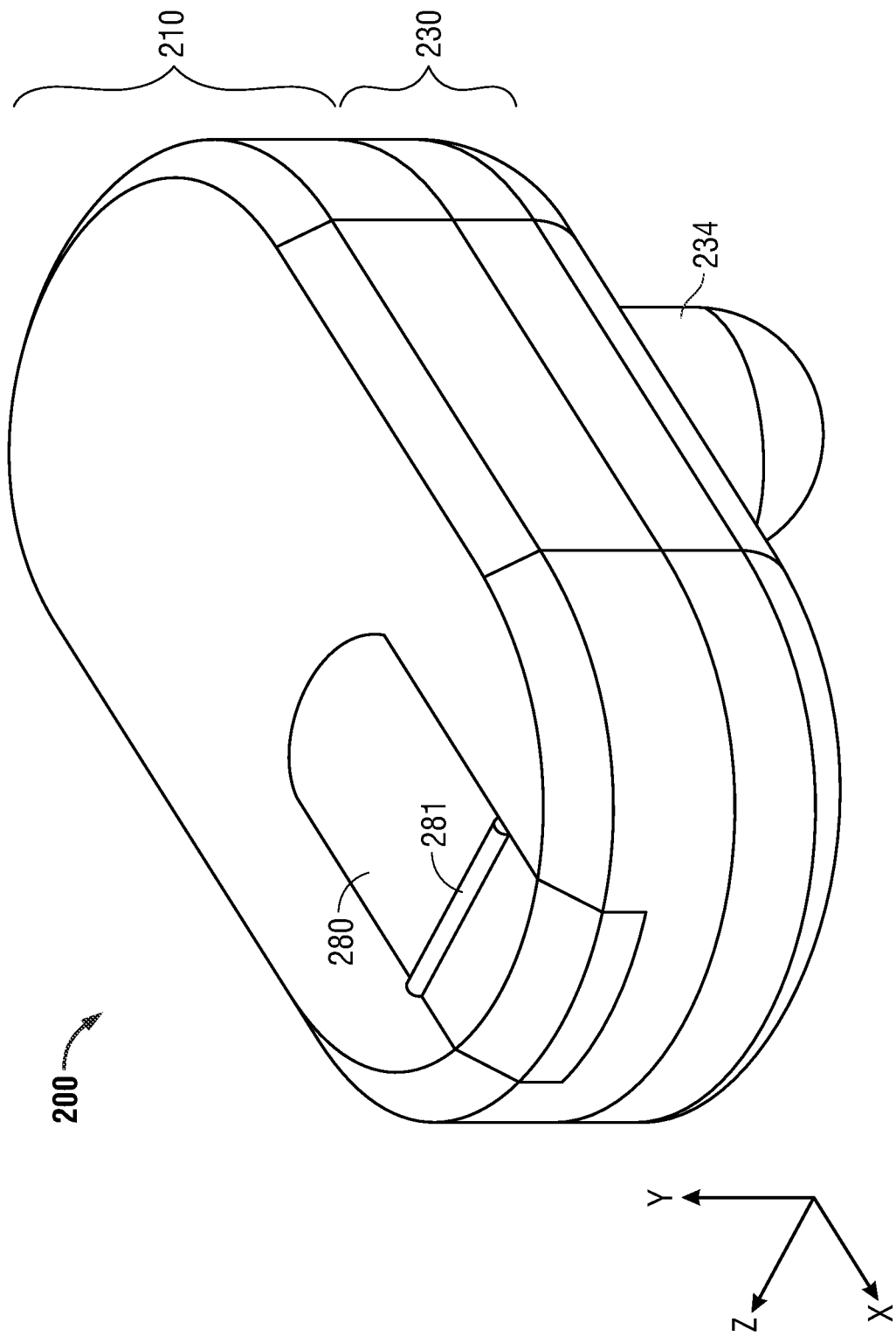
FIG. 2A is a graphical diagram illustrating a perspective view of a wearable hearing device in a closed configuration according to an embodiment of the present disclosure.

FIG. 2A is a graphical diagram illustrating a perspective view of a wearable hearing device that is a wearable earbud hearing device 200 placed in a closed configuration according to an embodiment of the present disclosure. The wearable earbud hearing device 200 in an embodiment may comprise an outer wearable hearing device housing 210 (e.g., situated farthest from the wearer when worn) joined with an inner wearable hearing device housing 230 (e.g., situated closest to the wearer when worn). The outer wearable hearing device housing 210 in an embodiment may be operably connected to or joined with a manual input magnetic slider switch 280, which may be moved with respect to the outer wearable hearing device housing 210. The magnetic slider switch 280 shown in FIG. 2A may depict a closed configuration in which the leading edge of the magnetic slider switch 280 lies flush with the leading edge of the outer wearable hearing device housing 210. A wearer of the wearable hearing device 200 in an embodiment may be capable of determining the magnetic slider switch 280 is in such a closed configuration by touching the wearable earbud hearing device 200 to feel that the leading edge of the magnetic slider switch 280 lies flush with the leading edge of the outer wearable hearing device housing 210, or to feel that little or no space exists between the trailing edge of the magnetic slider switch 280 and the outer wearable hearing device housing 210. The magnetic slider switch 280 may include a grip groove or raised surface 281 to assist the user in sliding the magnetic slider switch 280. In an embodiment, the wearable earbud hearing device 200 may further comprise an earbud 234 that includes a speaker for insertion within the wearer's ear canal during use. The outer wearable hearing device housing 210, inner wearable hearing device housing 230, and earbud 234 together may comprise a wearable hearing device housing that encloses various components of the wearable hearing device described with respect to FIG. 1 and include a microcontroller chip to execute some or all of an enhanced wearable hearing device command instruction manual input system, as described in greater detail herein.

Figure 2B:
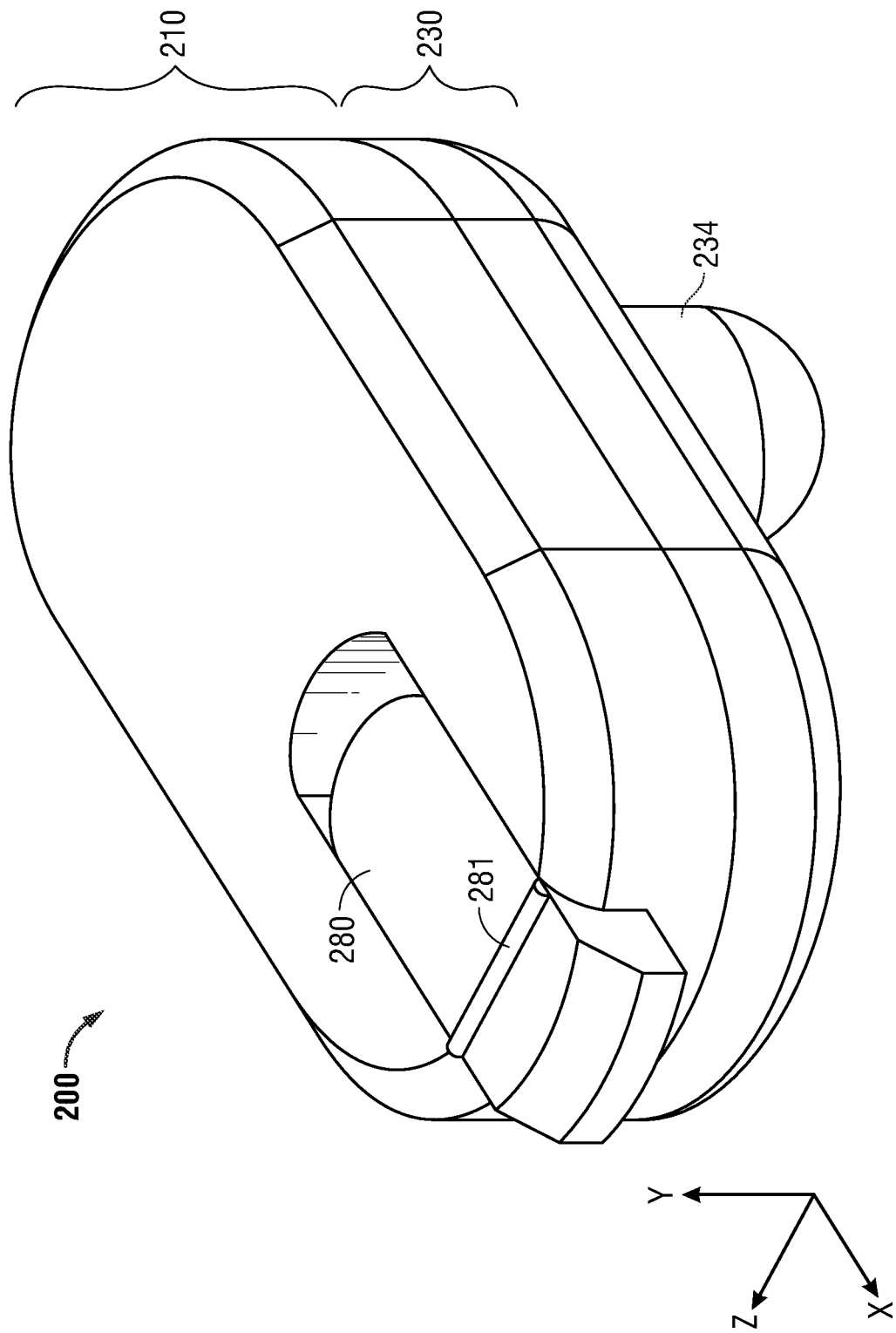
FIG. 2B is a graphical diagram illustrating a perspective view of a wearable hearing device in an open configuration according to an embodiment of the present disclosure.

FIG. 2B is a graphical diagram illustrating a perspective view of a wearable earbud hearing device 200 placed in an open configuration according to an embodiment of the present disclosure. The wearable earbud hearing device 200 in this embodiment also illustrates the outer wearable hearing device housing 210 joined with the inner wearable hearing device housing 230. The magnetic slider switch 280 shown in FIG. 2B may depict an open configuration in which the leading edge of the magnetic slider switch 280 protrudes beyond the leading edge of the outer wearable hearing device housing 210, or a void of space exists between the trailing edge of the magnetic slider switch 280 and the outer wearable hearing device housing 210 at the top part of a trough in which the magnetic slider switch 280 slides. A wearer of the wearable hearing device 200 in an embodiment may be capable of determining the magnetic slider switch 280 is in such an open configuration by touching the wearable earbud hearing device 200 to feel that the leading edge of the magnetic slider switch 280 extends beyond the leading edge of the outer wearable hearing device housing 210, or to feel that a void of space exists between the trailing edge of the magnetic slider switch 280 and the outer wearable hearing device housing 210. The wearable earbud hearing device 200 of FIG. 1B also shows the grip groove or raised surface 281 to assist the user in sliding the magnetic slider switch 280 as well as earbud 234 that includes a speaker for insertion within the wearer's ear canal during use.

Other embodiments may include one or more intermediate positions located between such an open configuration and a closed configuration. For example, such an intermediate position or configuration in an embodiment may be determined by the user by feeling that the trailing edge of the magnetic slider switch 280 is aligned with a hash mark or other type of physical indentation or raised surface on the outer wearable hearing device housing 210. It is contemplated that further embodiments herein describing such a multi-position magnetic slider switch which may be incorporated with the wearable earbud hearing device 200 of the present embodiments of FIGS. 2A and 2B.

Figure 3:
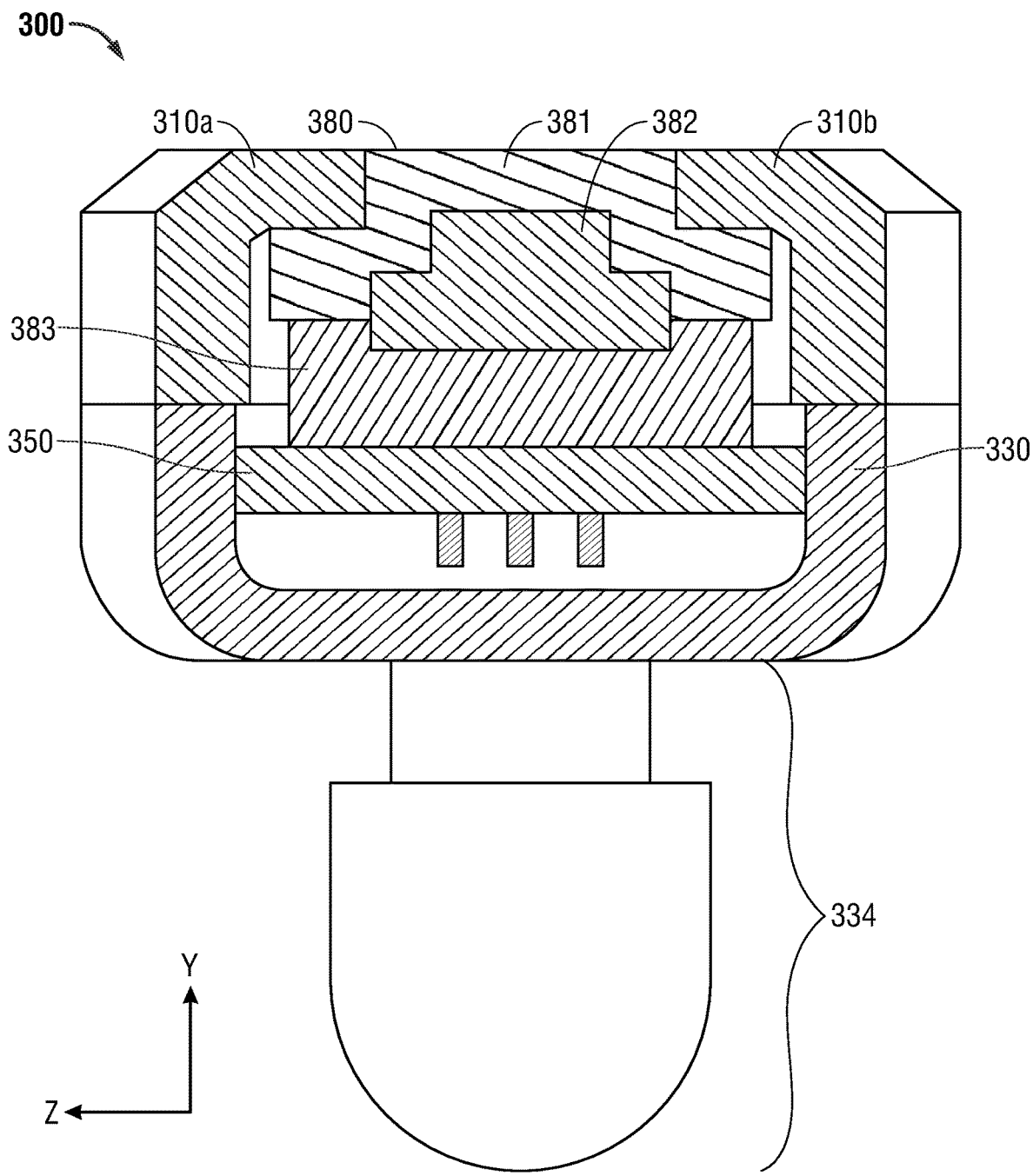
FIG. 3 is a graphical diagram illustrating a cutaway view of a wearable hearing device internal components according to an embodiment of the present disclosure.

FIG. 3 is a graphical diagram illustrating a cutaway view of a wearable earbud hearing device housing various internal components according to an embodiment of the present disclosure. The magnetic slider switch 380 in an embodiment may comprise an exterior portion 381 and an interior portion 382 to sit and slide within a trough within the outer wearable hearing device housing 310a. In an embodiment, the interior portion 382 of the magnetic slider switch 380 may operate to enclose a round magnet, as described in greater detail herein. As shown in FIG. 3, the magnetic slider switch exterior portion 381 and interior portion 382 may be operatively connected to and moveable with respect to the outer wearable hearing device housing (e.g., 310a and 310b). For example, a portion of the magnetic slider switch exterior portion 381 may extend below a left portion of the outer wearable hearing device housing 310a and below a right portion of the outer wearable hearing device housing 310b such that the magnetic slider switch exterior portion 380 remains coplanar with the outer surface of the outer wearable hearing device housing 310a and 310b.

The outer wearable hearing device housing 310a and 310b may be joined to the inner wearable hearing device housing 330 so as to enclose various components of the wearable hearing device 300, including a lubricated plastic layer such as a polyoxymethylene layer 383, a printed circuit board or microcontroller chip 350, a wireless system, a hall effect sensor, and a plurality of magnets, microphone, or other components as described in greater detail herein. An earbud 334 for a speaker may extend from the inner wearable hearing device housing 330 for insertion into a user's ear canal and may include a silicone tip for fit and comfort in an embodiment.

Figure 4A:
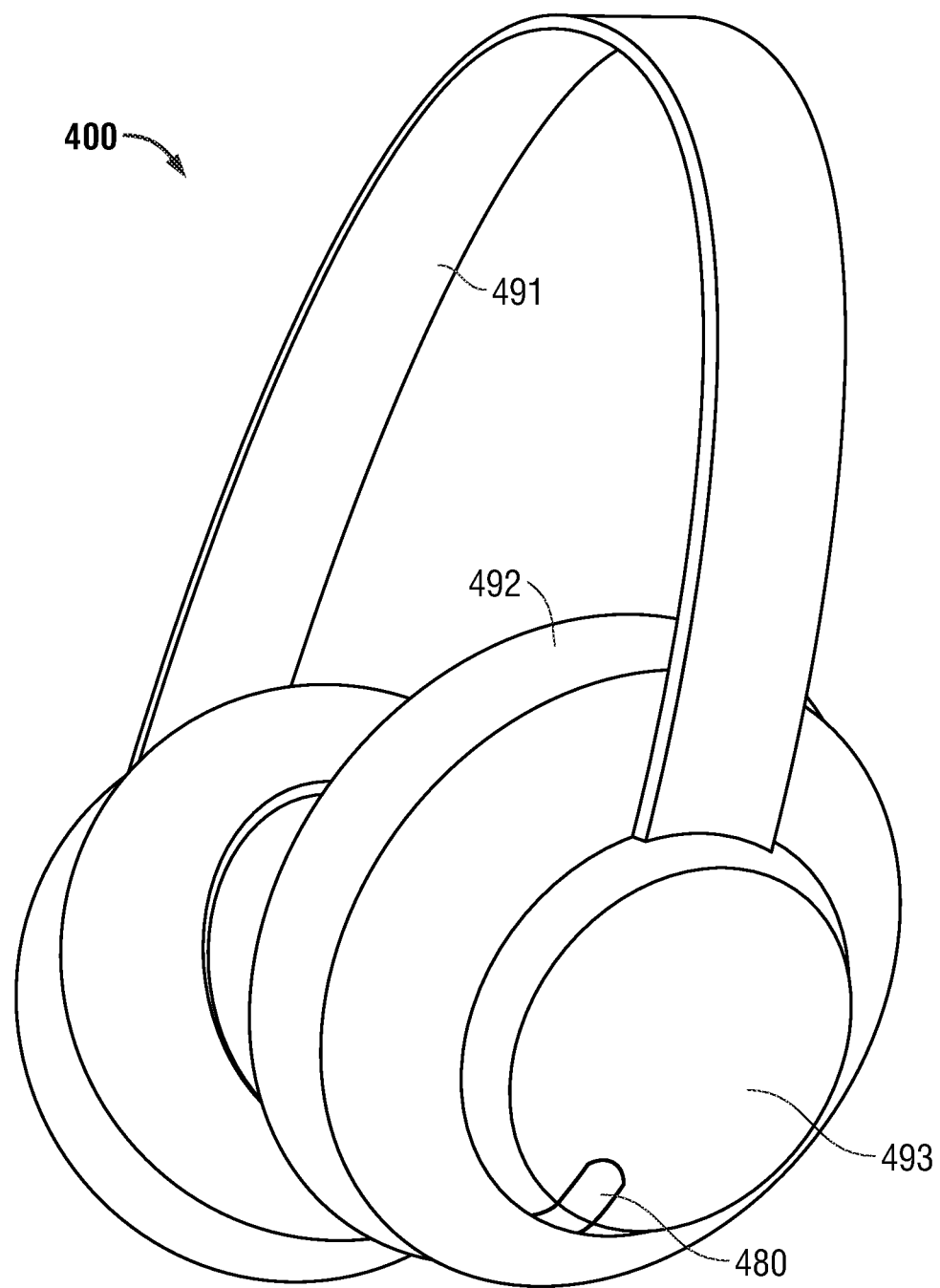
FIG. 4A is a graphical diagram illustrating a perspective view of a wearable headphone hearing device in a closed configuration according to an embodiment of the present disclosure.

FIG. 4A is a graphical diagram illustrating a perspective view of a wearable hearing device that is a wearable headphone hearing device 400 placed in a closed configuration according to an embodiment of the present disclosure. The wearable headphone hearing device 400 in an embodiment may comprise headphones 492 housing a speaker for placement over the wearer's ears, connected together via a headband 491. The headphone 492 may include a housing 493 in an embodiment, which may be operably connected to or joined with a manual input magnetic slider switch 480, which may be moved with respect to the headphone housing 493. The magnetic slider switch 480 shown in FIG. 4A may depict a closed configuration in which the leading edge of the magnetic slider switch 480 lies flush with the leading edge of the headphone housing 493. A wearer of the wearable headphone hearing device 400 in an embodiment may be capable of determining the magnetic slider switch 480 is in such a closed configuration by touching the wearable headphone hearing device 400 to feel that the leading edge of the magnetic slider switch 480 lies flush with the leading edge of the headphone housing 493, or to feel that little or no space exists between the trailing edge of the magnetic slider switch 480 and the headphone housing 493.

Figure 4B:
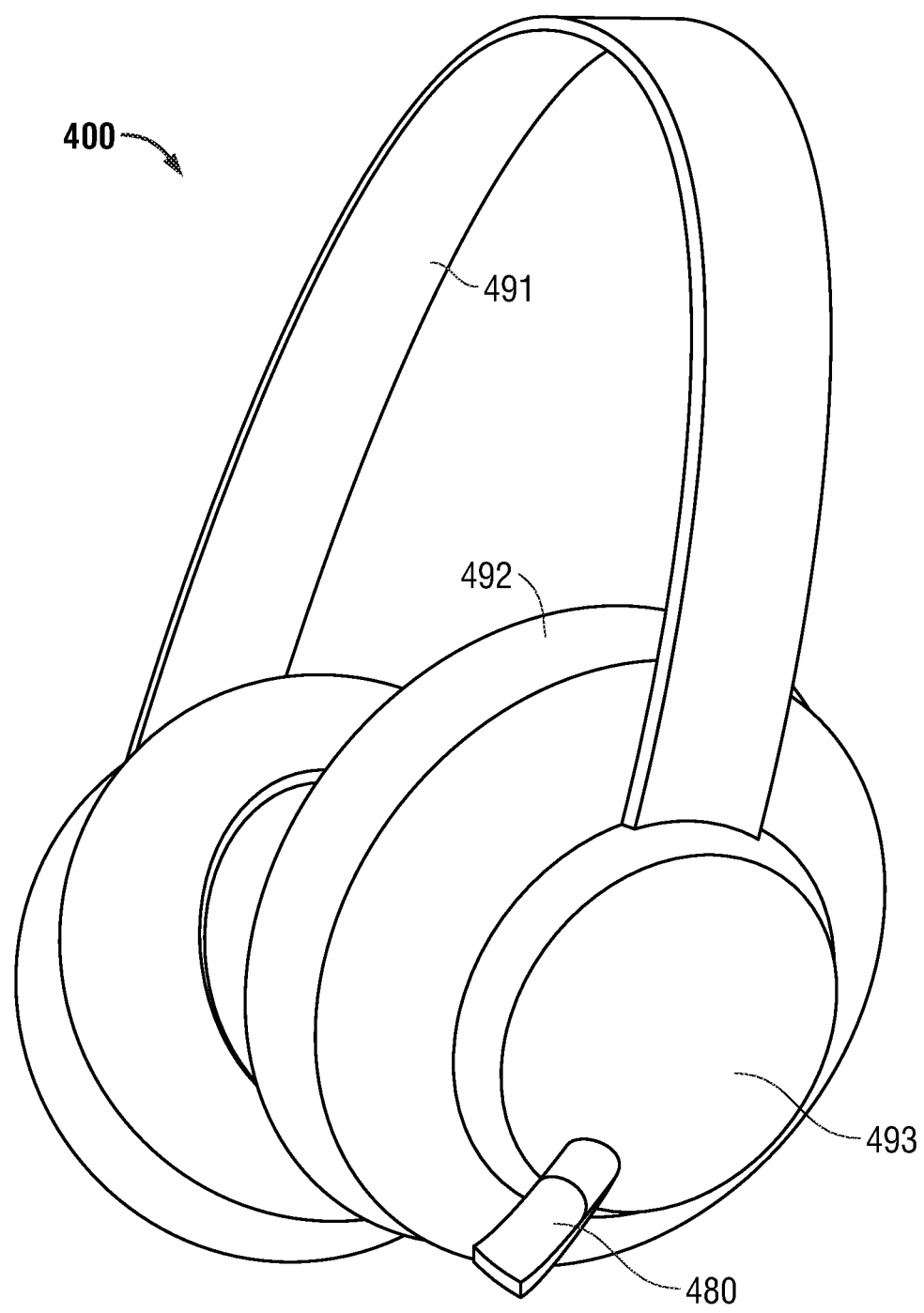
FIG. 4B is a graphical diagram illustrating a perspective view of a wearable headphone hearing device in an open configuration according to an embodiment of the present disclosure.

FIG. 4B is a graphical diagram illustrating a perspective view of a wearable hearing device that is a wearable headphone hearing device 400 placed in an open configuration according to an embodiment of the present disclosure. The magnetic slider switch 480 shown in FIG. 4B may depict an open configuration in which the leading edge of the magnetic slider switch 480 protrudes beyond the leading edge of the headphone housing 493, or a void of space exists between the trailing edge of the magnetic slider switch 480 and the headphone housing 493. A wearer of the wearable headphone hearing device 400 in an embodiment may be capable of determining the magnetic slider switch 480 is in such an open configuration by touching the wearable headphone hearing device 400 to feel that the leading edge of the magnetic slider switch 480 extends beyond the leading edge of the headphone housing 493, or to feel that a void of space exists between the trailing edge of the magnetic slider switch 480 and the headphone housing 493.

Other embodiments may include one or more intermediate positions located between such an open configuration and a closed configuration. For example, such an intermediate position or configuration in an embodiment may be determined by the user by feeling that the trailing edge of the magnetic slider switch 480 is aligned with a hash mark or other type of physical indentation or raised surface on the headphone housing 493. It is contemplated that further embodiments herein describing such a multi-position magnetic slider switch which may be incorporated with the wearable headset hearing device 400 of the present embodiments of FIGS. 4A and 4B.

FIG. 5A is a graphical diagram illustrating a cutaway view of a wearable hearing device that is a wearable earbud hearing device 500 according to an embodiment of the present disclosure. FIG. 5A illustrates a wearable hearing device housing, 510*a* and 510*b*, operably coupled to a magnetic slider switch 580 placed in a closed configuration according to a first embodiment of the present disclosure. As described herein, a wearable hearing device housing in an embodiment may comprise an outer wearable hearing device housing (e.g., 510*a* and 510*b*), an inner wearable hearing device housing 530, and an earbud 534 extending from the inner wearable hearing device housing 530. An exterior portion 581*a* of the magnetic slider switch 580 may be operatively connected to the outer wearable hearing device housing (e.g., 510*a* and 510*b*) and the inner wearable hearing device housing 530 to enclose a fixed bar magnet, a lubricated plastic layer (e.g., polyoxymethylene layer), a hall effect sensor 509, and a printed circuit board (PCB) 550. Printed circuit board 550 may include a microcontroller chip (not shown) to execute some or all of an enhanced wearable hearing device command instruction manual input system according to embodiments herein. The fixed bar magnet 521, 522 in an embodiment may have a fixed position with respect to the hall effect sensor 509, the outer wearable hearing device housing 510*a* and 510*b*, and the inner wearable hearing device housing 530, including a first bar magnet pole 521 having a first polarity (e.g., N) and a second bar magnet pole 522 having an opposite polarity (e.g., S). The lubricated plastic layer 582 may be disposed between the fixed bar magnet (e.g., including 521 and 522) and a rounded magnet (e.g., 523 and 524) in order to facilitate lateral movement (e.g., in the X direction) between an interior portion 581*b* of the magnetic slider switch 580 and the fixed bar magnet (e.g., 521 and 522). The hall effect sensor 509 may operate to sense a change in distance from the hall effect sensor 509 or a change in polarity of the rotating the rounded magnet (e.g., 523 and 524) when such lateral movement occurs. In an embodiment, the hall effect sensor 509 may transmit an indication that such movement or polarity change has occurred to a processor or microcontroller chip of the PCB 550 via an electrically conductive connection 551. The PCB 550 in an embodiment may be operatively connected to a speaker magnet 532 and a speaker 533 within the inner wearable device housing 530 or within the earbud 534 via an electrically conductive connection 552.

A circular or rounded magnet in an embodiment comprising a first rounded magnet pole 523 having a first polarity (e.g., S) and a second rounded magnet pole 524 (e.g., N) may be housed between the exterior portion 581*a* of the magnetic slider switch 580 and the interior portion 581*b* of the magnetic slider switch 580 such that the rounded magnet is capable of rotating freely. In some embodiments, the rounded magnet may be lubricated to ease such rotational movement. The rounded magnet in such an embodiment may be capable of rotational motion about an axis in the Z dimension (e.g., coming out of the FIG. 5A page). FIG. 5A depicts the exterior surface 581*a* of the magnetic slider switch in a closed position or configuration, in which the leading edge (e.g., left-hand edge) of the exterior surface 581*a* of the magnetic slider switch 580 lies flush with the leading edge (e.g., left-hand edge) of the outer wearable hearing device housing 510*b*. While in the closed configuration, the second rounded magnet pole 524 (e.g., N) may be attracted to the second bar magnet pole 522 (e.g., S), such that a user must apply sufficient exterior force to overcome this strong attraction in order to move the exterior surface of the magnetic slider switch 580 with respect to the outer wearable hearing device housing 510*b* to move the magnetic slider switch 580 to an open position.

PCB 550 may be operatively coupled to any microphone 511 of the wearable earbud hearing device to receive audio data at the microcontroller chip in PCB 550 from the microphone 511 in an embodiment when the magnetic slider switch 580 is moved in the closed position. In such an embodiment, the microcontroller chip may transmit the audio signal to the paired information handling system from microphone 511 and receive audio signals from the paired information handling system for speaker 533 via a wireless system on PCB 550.

Figure 5B:
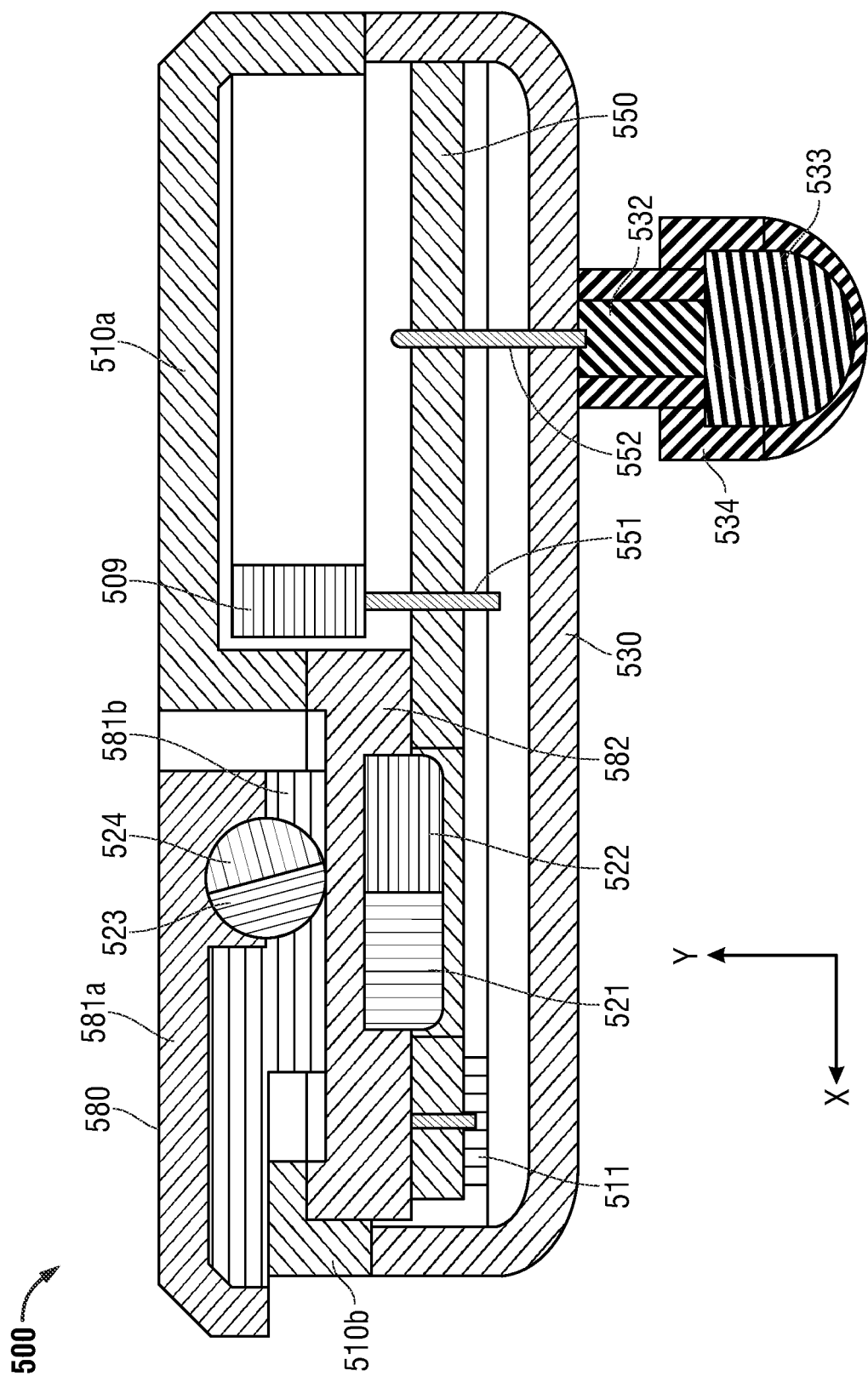
FIG. 5B is a graphical diagram illustrating a cutaway view of a wearable hearing device magnetic slider switch between open and closed configurations according to a first embodiment of the present disclosure.

FIG. 5B is a graphical diagram illustrating a cutaway side view of a wearable hearing device that is a wearable earbud hearing device 500, with a wearable hearing device housing operably connected to a magnetic slider switch 580 moving between a closed configuration and an open configuration according to a first embodiment of the present disclosure. As described in greater detail herein, a user may apply exterior force to the exterior portion 581*a* of the magnetic slider switch 580 to cause the exterior portion 581*a* of the magnetic slider switch 580, the interior portion 581*b* of the magnetic slider switch 580, and the rounded magnet (e.g., 523 and 524) to move to the left (in the X direction) with respect to the outer wearable hearing device housing 510*a* and 510*b*, the inner wearable hearing device housing 530, and the fixed bar magnet 522. As the exterior portion 581*a* of the magnetic slider switch 580, the interior portion 581*b* of the slider switch 580, and the rounded magnet (e.g., 523 and 524) move laterally in such a way, the attraction between the second pole 524 (e.g., N) of the rounded magnet and the second pole 522 (e.g., S) of the fixed bar magnet may cause the rounded magnet to rotate with respect to the exterior surface 581*a* of the magnetic slider switch 580 and the interior surface 581*b* of the magnetic slider switch 580, as depicted in FIG. 5B (e.g., as compared to FIG. 5A). Thus, in order to move the magnetic slider switch 580 laterally in such a way to slide from a closed position to an open position, the user may apply exterior force sufficient to overcome this attraction between the second pole 524 (e.g., N) of the rounded magnet and the second pole 522 (e.g., S) of the fixed bar magnet. However, as the rounded magnet continues to rotate with further lateral movement, eventually the first pole 523 (e.g., S) of the rounded magnet will be increasingly attracted to the first pole 521 (e.g., N) of the fixed bar magnet. Once this occurs, the magnetic attraction between the first pole 521 of the fixed bar magnet and the first pole 523 of the rounded magnet may act as a spring to pull the rounded magnet (e.g., 523 and 524), and both the exterior and interior surfaces (e.g., 581*a*, and 581*b*) of the magnetic slider switch 580 into the open configuration described below with respect to FIG. 5C. This magnetic effect may decrease the amount of force the user must exert to move the magnetic slider switch into an open configuration, thus decreasing the chance that such an action may dislodge the earbud 534 from the user's ear canal.

Figure 5C:
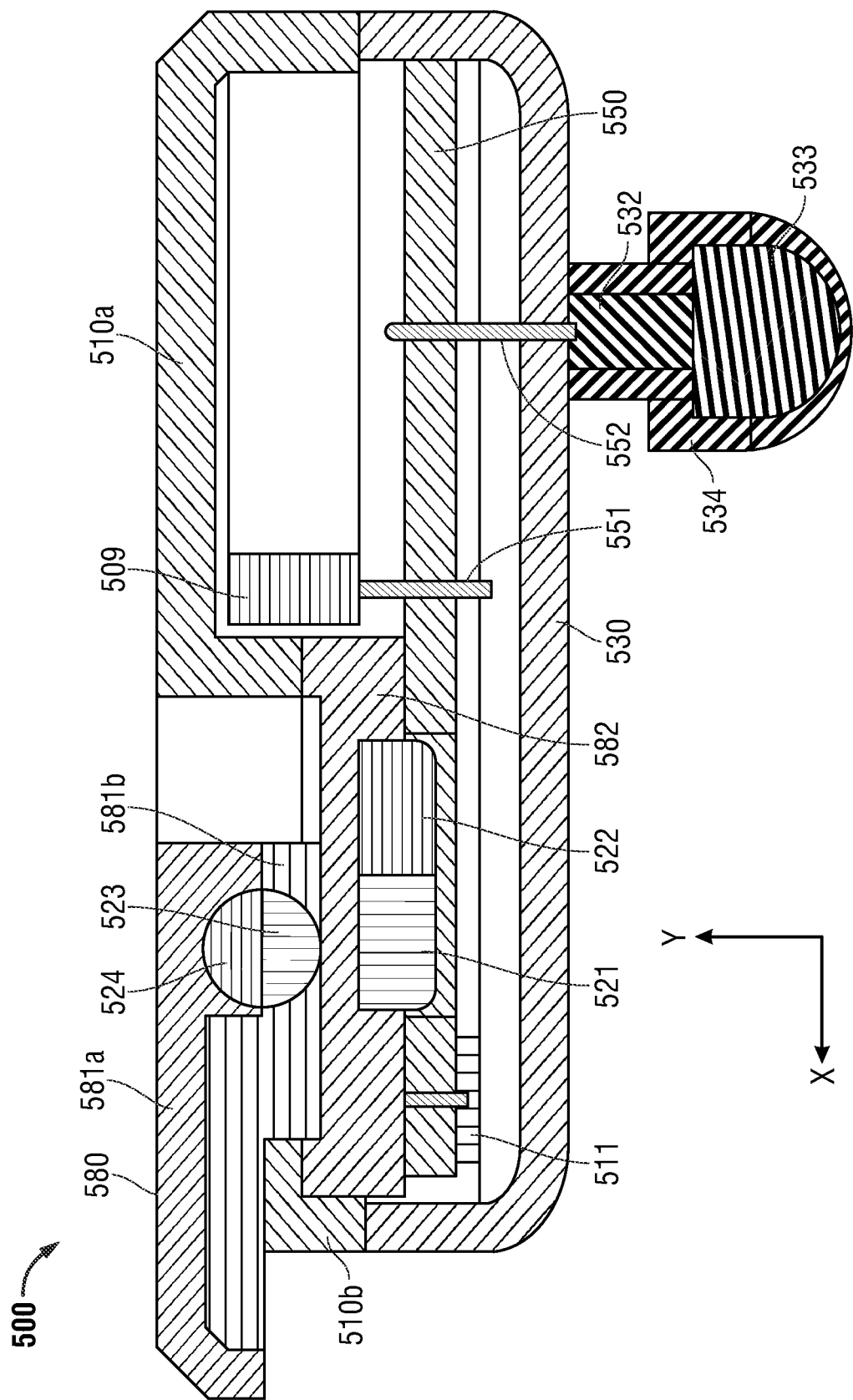
FIG. 5C is a graphical diagram illustrating a cutaway view of a wearable hearing device magnetic slider switch in an open configuration according to a first embodiment of the present disclosure.

FIG. 5C is a graphical diagram illustrating a cutaway side view of a wearable hearing device that is a wearable earbud hearing device 500, with a wearable hearing device housing operably connected to a magnetic slider switch 580 placed in an open configuration according to a first embodiment of the present disclosure. Once the magnetic attraction between the first rounded magnet pole 523 and the first bar magnet pole 521 exceeds the magnetic attraction between the second rounded magnet pole 524 and the second bar magnet pole 522 in an embodiment, the rounded magnet (e.g., 523 and 524) and the interior and exterior surfaces (e.g., 581a, and 581b) of the magnetic slider switch 580 may spring into an open configuration without any external application of force from the user. This may cause the leading edge (e.g., left-hand edge) of the exterior surface 581a of the magnetic slider switch 580 to move beyond the leading edge (e.g., left-hand edge) of the outer wearable hearing device housing 510b, and to leave a gap between the exterior surface 580 of the magnetic slider switch and the outer wearable hearing device housing 510a. The user may be capable of determining that the magnetic slider switch is placed in an open configuration by feeling either that the leading edges of the magnetic slider switch 580 and the outer wearable hearing device housing 510b are not flush with one another, or by feeling that there is the gap between the exterior surface 580 of the magnetic slider switch and the outer wearable hearing device housing 510a.

The hall effect sensor 509 may detect a change in distance between the hall effect sensor 509 and the rounded magnet (e.g., 523 and 524) upon movement from the open configuration to the closed configuration or vice versa in an embodiment. Upon detection of such movement in an embodiment, the hall effect sensor 509 may transmit an indication of the current configuration (e.g., open or closed) to a microcontroller chip of the PCB 550. In an embodiment, the hall effect sensor 509 may transmit an indication that such movement or polarity change has occurred to a processor or microcontroller chip of the PCB 550 via an electrically conductive connection 551. The PCB 550 in an embodiment may also be operatively connected to a speaker magnet 532 and a speaker 533 within the inner wearable device housing 530 or within the earbud 534 via an electrically conductive connection 552. PCB 550 may be operatively coupled to any microphone 511 of the wearable earbud hearing device to receive an instruction from a microcontroller chip in PCB 550 to mute the microphone 511 in an embodiment when the magnetic slider switch 580 is moved to the open position. In another embodiment, the microcontroller chip may transmit an instruction to the paired information handling system to stop receiving audio signals from microphone 511 via a wireless radio system on PCB 550.

Figure 6A:
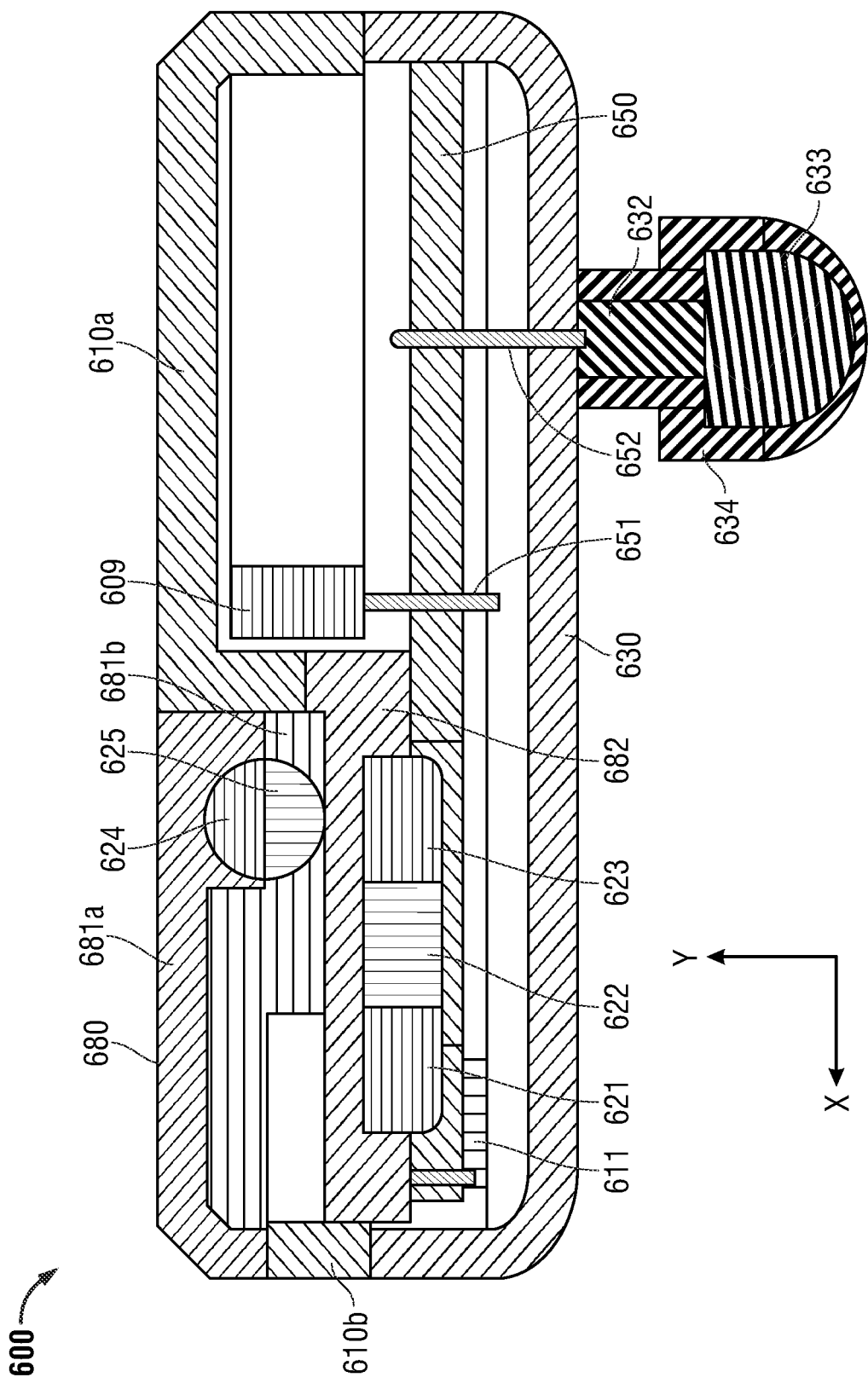
FIG. 6A is a graphical diagram illustrating a cutaway view of a wearable hearing device magnetic slider switch in a closed configuration according to a second embodiment of the present disclosure.

FIG. 6A is a graphical diagram illustrating a cutaway side view of a wearable hearing device that is a wearable earbud hearing device 600, with a wearable hearing device housing operably connected to a magnetic slider switch 680 placed in a closed configuration or position according to a second embodiment of the present disclosure. In some embodiments, one or more intermediate switch positions may be located between such a full open configuration and a full closed configuration. For example, in an embodiment shown in FIG. 6A, the fixed bar magnet may include a first bar magnet pole 621 having a first polarity (e.g., N), a second bar magnet pole 622 having an opposite polarity (e.g., S), and a third bar magnet pole 623 having the same polarity (e.g., N) as the first bar magnet pole 621. This is but one embodiment and it is contemplated that any series of opposing polarity portions of the bar magnet may be used in other embodiments.

The circular or rounded magnet in such an embodiment comprising a first rounded magnet pole 624 having a first polarity (e.g., N) and a second rounded magnet pole 625 having an opposite polarity (e.g., S) may be housed between the exterior portion 681a of the magnetic slider switch 680 and the interior portion 681b of the magnetic slider switch 680 such that the rounded magnet is capable of rotating freely. FIG. 6A depicts the exterior surface 681a of the magnetic slider switch 681a in a closed position or configuration, in which the leading edge (e.g., left-hand edge) of the exterior surface 681a of the magnetic slider switch 680 lies flush with the leading edge (e.g., left-hand edge) of the outer wearable hearing device housing 610b. While in the closed configuration, the second rounded magnet pole 625 (e.g., S) may be strongly attracted to the third bar magnet pole 623 (e.g., N), such that a user must apply sufficient exterior force to overcome this strong attraction in order to move the exterior surface 681a of the magnetic slider switch 680 with respect to the outer wearable hearing device housing 610b. In an embodiment, a hall effect sensor 609 may detect the distance or polarity orientation of the circular magnet in the horizontal direction. The hall effect sensor 609 may transmit an indication that such movement or polarity change has occurred to a processor or microcontroller chip of the PCB 650 via an electrically conductive connection 651. The PCB 650 in an embodiment may also be operatively connected to a speaker magnet 632 and a speaker 633 within the inner wearable device housing 630 or within the earbud 634 via an electrically conductive connection 652. PCB 650 may be operatively coupled to any microphone 611 of the wearable earbud hearing device to receive audio data from the microphone 611 and to the speaker 633 to provide audio data from a paired information handling system for audio communication. In an embodiment, the microcontroller chip may transmit or receive audio data with a paired information handling system for microphone 611 or speaker 633 via a wireless radio system on PCB 650.

Figure 6B:
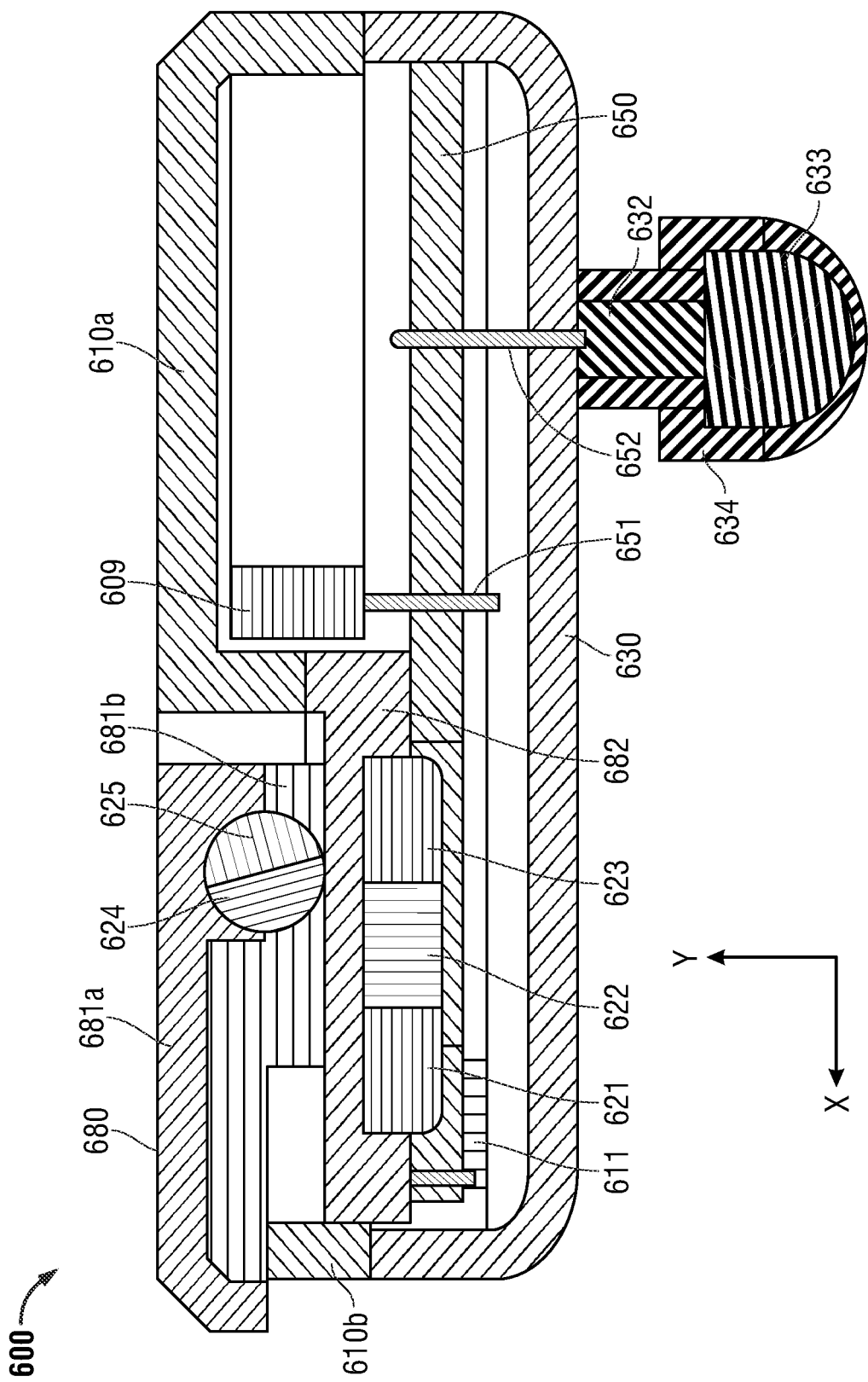
FIG. 6B is a graphical diagram illustrating a cutaway view of a wearable hearing device magnetic slider switch between intermediate and closed configurations according to a second embodiment of the present disclosure.

FIG. 6B is a graphical diagram illustrating a cutaway side view of a wearable hearing device that is a wearable earbud hearing device 600, with a wearable hearing device housing operably connected to a magnetic slider switch moving between a closed configuration or position and an intermediate configuration or position according to a second embodiment of the present disclosure. As described in greater detail herein, a user may apply exterior force to the exterior portion of the magnetic slider switch 680 to cause the exterior portion 681a of the magnetic slider switch 680, the interior portion 681b of the slider switch 680, and the rounded magnet (e.g., 624 and 625) to move to the left (in the X direction) with respect to the outer wearable hearing device housing 610a and 610b, the inner wearable hearing device housing 630, and the fixed bar magnet (e.g., 621, 622, and 623). As the exterior portion of the magnetic slider switch 680, the interior portion 681b of the magnetic slider switch 680, and the rounded magnet (e.g., 624 and 625) move laterally in such a way, the attraction between the second pole 625 (e.g., S) of the rounded magnet and the third pole 623 (e.g., N) of the fixed bar magnet may cause the rounded magnet to rotate with respect to the exterior surface 681a of the magnetic slider switch 680 and the interior surface 681b of the magnetic slider switch 680, as depicted in FIG. 6B (e.g., as compared to FIG. 6A). Thus, in order to move the magnetic slider switch 680 laterally in such a way, the user may apply exterior force sufficient to overcome this attraction between the second pole 625 (e.g., S) of the rounded magnet and the third pole 623 (e.g., N) of the fixed bar magnet. However, as the rounded magnet continues to rotate with further lateral movement, eventually the first pole 624 (e.g., N) of the rounded magnet will be increasingly attracted to the second pole 622 (e.g., S) of the fixed bar magnet. Once this occurs, the magnetic attraction between the second pole 622 of the fixed bar magnet and the first pole 624 of the rounded magnet may act as a spring to pull the rounded magnet (e.g., 624 and 625), and both the exterior and interior surfaces (e.g., 681*a* and 681*b* respectively) of the magnetic slider switch 680 into an intermediate configuration (e.g., between open and closed configuration) described below with respect to FIG. 6C. This magnetic effect may decrease the amount of force the user must exert to move the magnetic slider switch into an intermediate configuration, thus decreasing the chance that such an action may dislodge the earbud 634 from the user's ear canal.

Figure 6C:
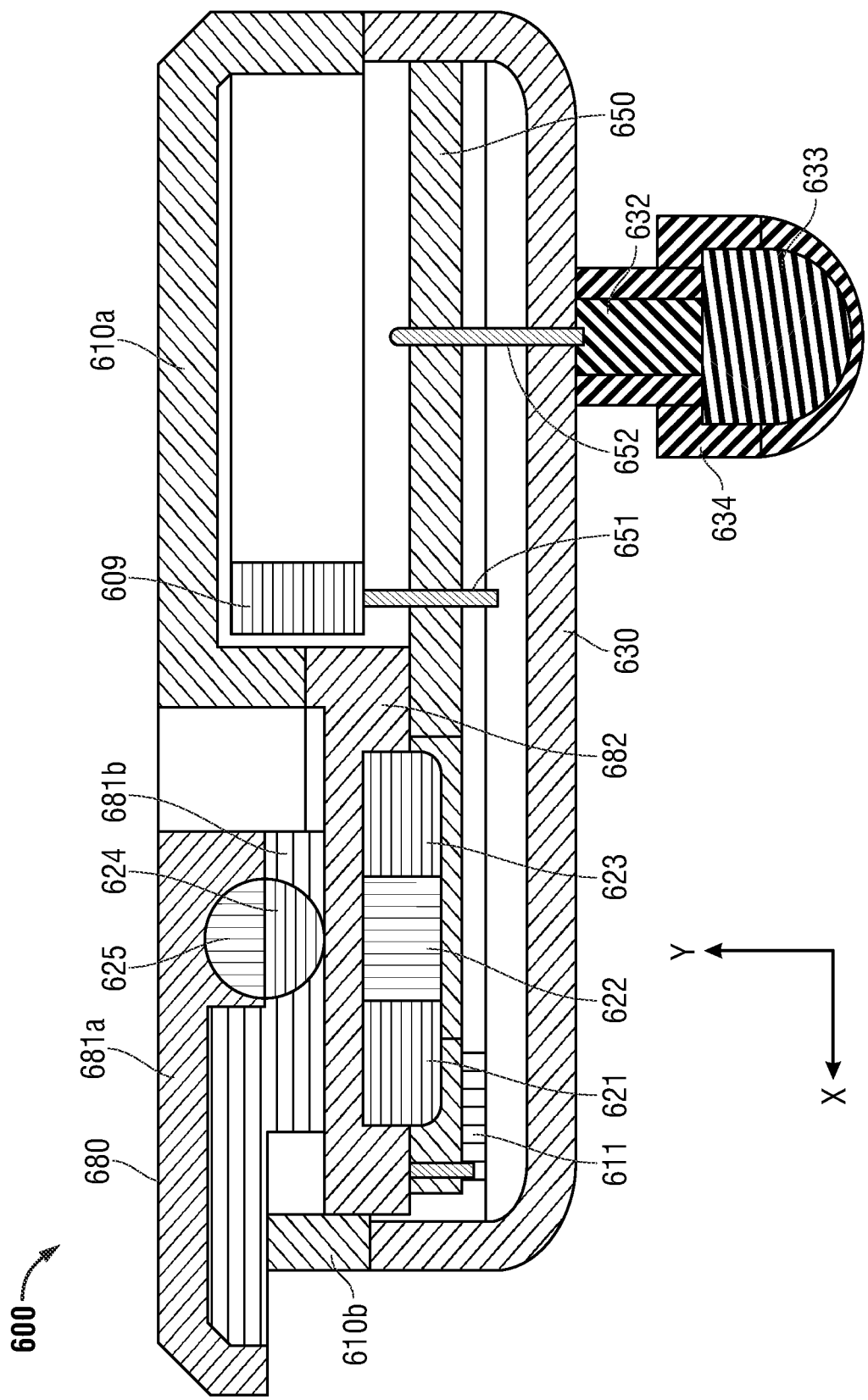
FIG. 6C is a graphical diagram illustrating a cutaway view of a wearable hearing device magnetic slider switch in an intermediate configuration according to a second embodiment of the present disclosure.

FIG. 6C is a graphical diagram illustrating a cutaway side view of a wearable hearing device that is a wearable earbud hearing device 600, with a wearable hearing device housing operably connected to a magnetic slider switch 680 placed in an intermediate configuration or position according to a second embodiment of the present disclosure. Once the magnetic attraction between the first rounded magnet pole 624 and the second bar magnet pole 622 exceeds the magnetic attraction between the second rounded magnet pole 625 and the third bar magnet pole 623 in an embodiment, the rounded magnet (e.g., 624 and 625) and the interior and exterior surfaces (e.g., 681*a* and 681*b* respectively) of the magnetic slider switch 680 may spring into an intermediate configuration without any external application of force from the user. This may cause the leading edge (e.g., left-hand edge) of the exterior surface 680 of the magnetic slider switch to move beyond the leading edge (e.g., left-hand edge) of the outer wearable hearing device housing 610*b*, and to leave a gap between the exterior surface 681*b* of the magnetic slider switch 680 and the outer wearable hearing device housing 610*a*. Both the extension beyond the leading edge (e.g., left-hand edge) and the gap may be of a medium size in an embodiment. The user may be capable of determining that the magnetic slider switch 680 is placed in an intermediate configuration by feeling either that the leading edges of the magnetic slider switch 680 and the outer wearable hearing device housing 610*b* are not flush with one another, by feeling the gap between the exterior surface 681*a* of the slider switch 680 and the outer wearable hearing device housing 610*a*, or by sensing that the trailing edge (e.g., right hand side) of the exterior surface 681*a* of the magnetic slider switch 680 lines up with an indentation or raised surface hash mark on the outer wearable hearing device housing 610*a*.

The hall effect sensor 609 may detect a change in distance or polarity orientation between the hall effect sensor 609 and the rounded magnet (e.g., 624 and 625) upon movement from the closed configuration to the intermediate configuration or vice versa in an embodiment. Upon detection of such movement in an embodiment, the hall effect sensor 609 may transmit an indication of the current configuration (e.g., intermediate) to a processor of the PCB 650.

In an embodiment, the hall effect sensor 609 may transmit an indication that such movement or polarity change has occurred to a processor or microcontroller chip of the PCB 650 via an electrically conductive connection 651. The PCB 650 in an embodiment may also be operatively connected to a speaker magnet 632 and a speaker 633 within the inner wearable device housing 630 or within the earbud 634 via an electrically conductive connection 652. PCB 650 may be operatively coupled to any microphone 611 of the wearable earbud hearing device. Detecting the intermediate position may include a user input to generate an instruction from a microcontroller chip in PCB 650 for some function of the wearable earbud hearing device 600. For example, when the magnetic slider switch 680 is moved to the intermediate position, this may generate a function instruction for the intermediate position such as muting the microphone 611 in an embodiment. Any second function may be associated with the intermediate position in various embodiments. In another embodiment, the microcontroller chip may transmit an instruction to the paired information handling system to execute a function there with respect to a voice communication application or a media application relating to the audio signals such as to pause a playback or stop transmitting or receiving audio signals to a speaker 633 or from microphone 611 via a wireless radio system on PCB 650.

Figure 6D:
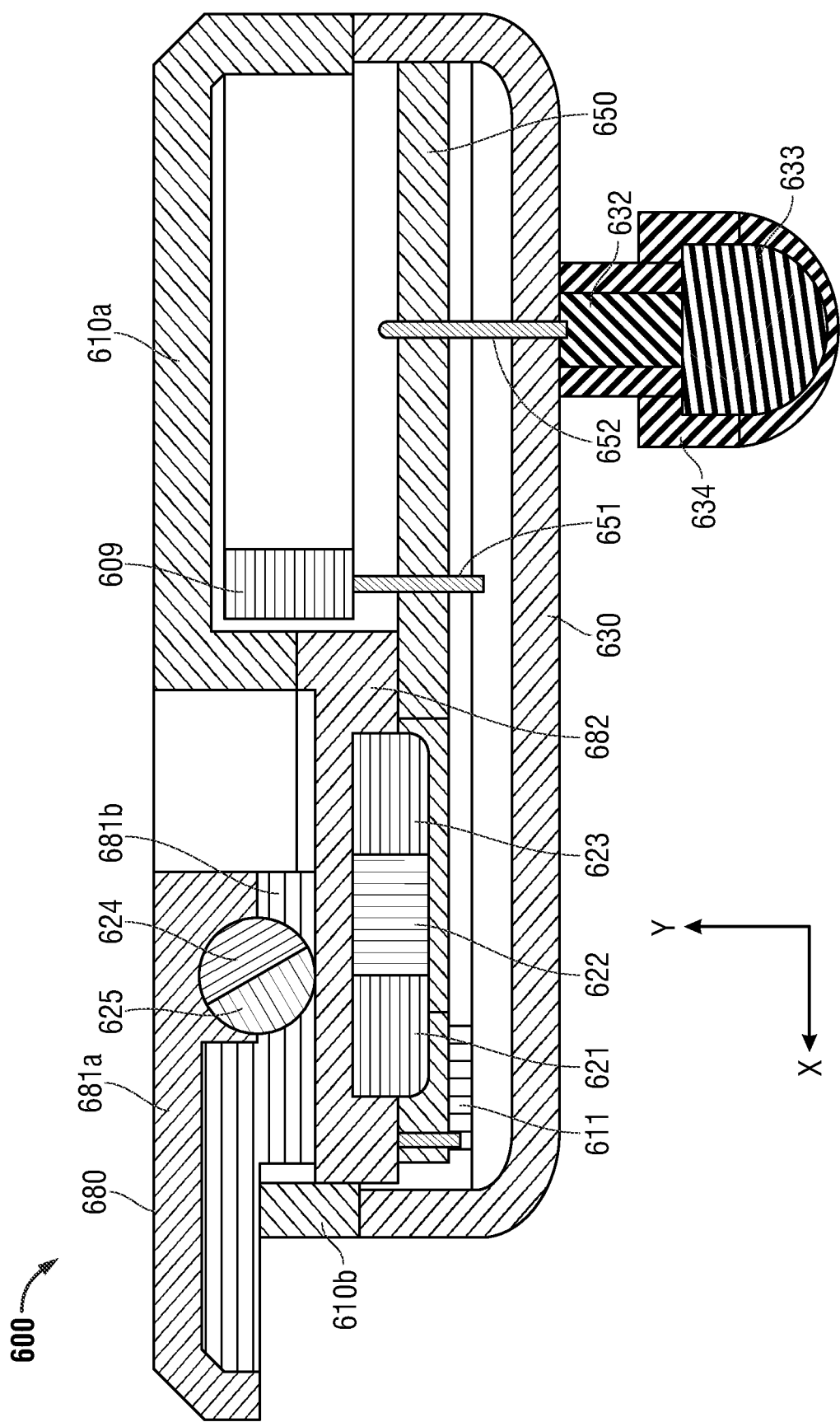
FIG. 6D is a graphical diagram illustrating a cutaway view of a wearable hearing device magnetic slider switch between open and intermediate configurations according to a second embodiment of the present disclosure.

FIG. 6D is a graphical diagram illustrating a cutaway side view of a wearable hearing device that is a wearable earbud hearing device 600, with a wearable hearing device housing operably connected to a magnetic slider switch 680 moving between an intermediate configuration or position and an open configuration or position according to a second embodiment of the present disclosure. As described in greater detail herein, a user may apply exterior force to the exterior portion of the magnetic slider switch 680 to cause the exterior portion 681*a* of the magnetic slider switch 680, the interior portion 681*b* of the magnetic slider switch 680, and the rounded magnet (e.g., 624 and 625) to move to the left (in the X direction) with respect to the outer wearable hearing device housing 610*a* and 610*b*, the inner wearable hearing device housing 630, and the fixed bar magnet (e.g., 621, 622, and 623). As the exterior portion 681*a* of the magnetic slider switch 680, the interior portion 681*b* of the magnetic slider switch 680, and the rounded magnet (e.g., 624 and 625) move laterally in such a way, the attraction between the first pole 624 (e.g., N) of the rounded magnet and the second pole 622 (e.g., S) of the fixed bar magnet may cause the rounded magnet to rotate with respect to the exterior surface 681*a* of the magnetic slider switch 680 and the interior surface 681*b* of the magnetic slider switch 680, as depicted in FIG. 6D (e.g., as compared to FIG. 6C). Thus, in order to move the magnetic slider switch 680 laterally in such a way, the user may apply exterior force sufficient to overcome this attraction between the first pole 624 (e.g., N) of the rounded magnet and the second pole 622 (e.g., S) of the fixed bar magnet. However, as the rounded magnet continues to rotate with further lateral movement, eventually the second pole 625 (e.g., S) of the rounded magnet will be increasingly attracted to the first pole 621 (e.g., N) of the fixed bar magnet. Once this occurs, the magnetic attraction between the first pole 621 of the fixed bar magnet and the second pole 625 of the rounded magnet may act as a spring to pull the rounded magnet (e.g., 624 and 625), and both the exterior and interior surfaces (e.g., 681*a* and 681*b* respectively) of the magnetic slider switch 680 into the open configuration described below with respect to FIG. 6E. This magnetic effect may decrease the amount of force the user must exert to move the magnetic slider switch 680 into an open configuration or position, thus decreasing the chance that such an action may dislodge the earbud 634 from the user's ear canal.

Figure 6E:
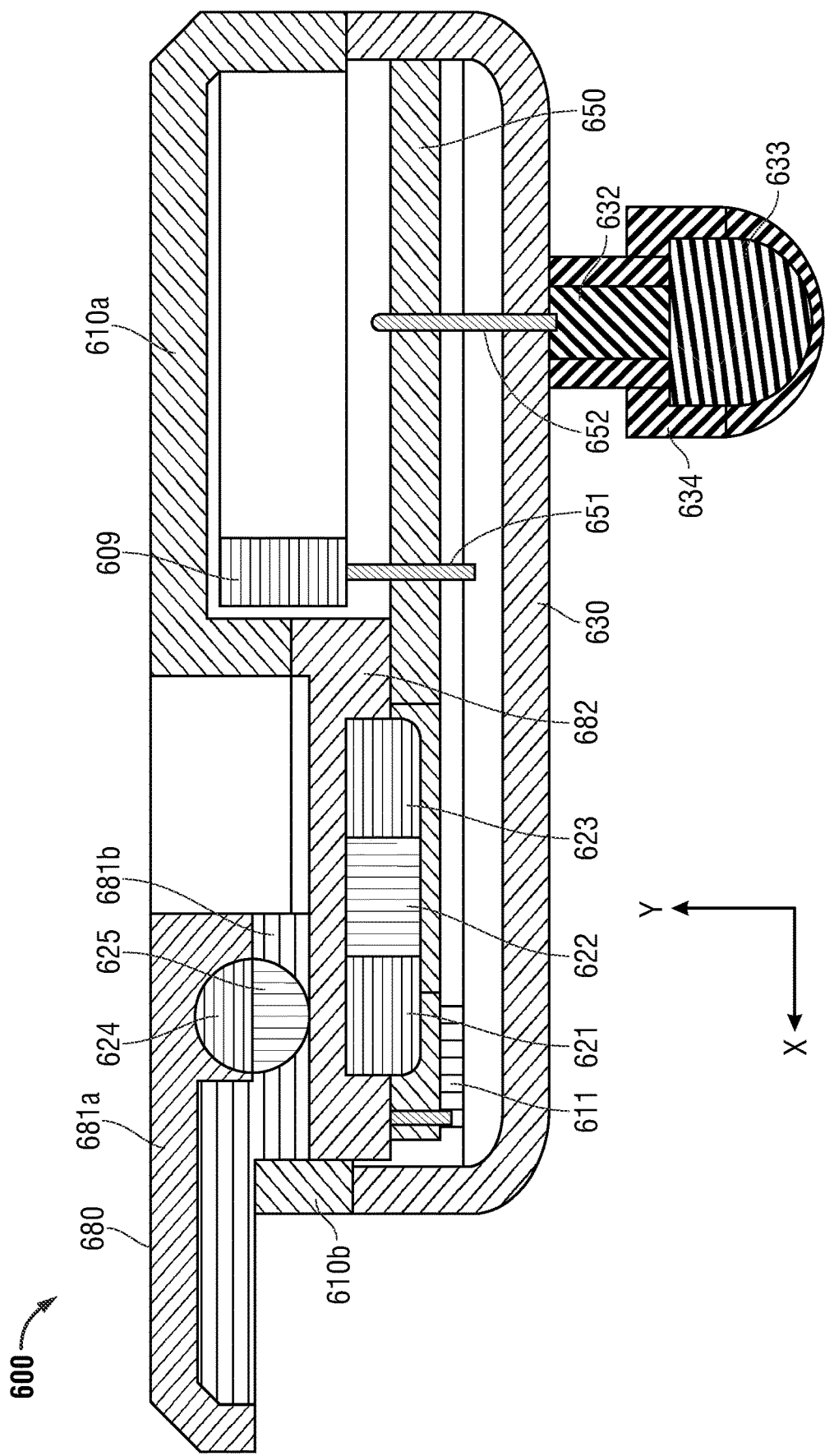
FIG. 6E is a graphical diagram illustrating a cutaway view of a wearable hearing device magnetic slider switch in an open configuration according to a second embodiment of the present disclosure.

FIG. 6E is a graphical diagram illustrating a cutaway side view of a wearable hearing device that is a wearable earbud hearing device 600, with a wearable hearing device housing operably connected to a magnetic slider switch 680 placed in an open configuration or position according to a second embodiment of the present disclosure. Once the magnetic attraction between the second rounded magnet pole 625 and the first bar magnet pole 621 exceeds the magnetic attraction between the first rounded magnet pole 624 and the second bar magnet pole 622 in an embodiment, the rounded magnet (e.g., 624 and 625) and the interior and exterior surfaces (e.g., 681*a* and 681*b* respectively) of the magnetic slider switch 680 may spring into an open configuration without any external application of force from the user. This may cause the leading edge (e.g., left-hand edge) of the exterior surface 681*a* of the magnetic slider switch 680 to move farther beyond the leading edge (e.g., left-hand edge) of the outer wearable hearing device housing 610*b*, and to leave a larger gap between the exterior surface 681*a* of the magnetic slider switch 680 and the outer wearable hearing device housing 610*a*. The user may be capable of determining that the magnetic slider switch 680 is placed in an open or third function configuration or position by feeling either that the leading edges of the magnetic slider switch 680 and the outer wearable hearing device housing 610*b* are not flush with one another at a larger protrusion, by sensing the larger gap between the exterior surface 681*a* of the magnetic slider switch 680 and the outer wearable hearing device housing 610*a*, or by sensing that the trailing edge (e.g., right hand side) of the exterior surface 681*a* of the magnetic slider switch 680 lines up with a second indentation or raised surface hash mark on the outer wearable hearing device housing 510*a*.

The hall effect sensor 609 may detect a change in distance between the hall effect sensor 609 and the rounded magnet (e.g., 624 and 625) upon movement from the intermediate configuration to the open configuration or vice versa in an embodiment. Upon detection of such movement in an embodiment, the hall effect sensor 609 may transmit an indication of the current configuration (e.g., open) to a processor of the PCB 650. In an embodiment, the hall effect sensor 609 may transmit an indication that such movement or polarity change has occurred yet again with the round magnet relative to the hall effect sensor 609 to a processor or microcontroller chip of the PCB 650 via an electrically conductive connection 651. The PCB 650 in an embodiment may also be operatively connected to a speaker magnet 632 and a speaker 633 within the inner wearable device housing 630 or within the earbud 634 via an electrically conductive connection 652. PCB 650 may be operatively coupled to any microphone 611 of the wearable earbud hearing device. Detecting the current configuration (e.g., open) position may represent a user input to generate an instruction from a microcontroller chip in PCB 650 for some function of the wearable earbud hearing device 600 and may be any instruction. For example, the current open position may include a function instruction for the open position such as ending a call or stopping a playback for the speaker 633 and the microphone 611 in an embodiment. Any second function may be associated with the open position in various embodiments. In another embodiment, the microcontroller chip may transmit an instruction to the paired information handling system to execute a function there with respect to a voice communication software application or a media application relating to the audio signals such as to ending a call or playback via a wireless radio system on PCB 650 in an embodiment. As can be appreciated, any number of function positions of the magnetic slider switch 680 may be used with the wearable earbud hearing device 600 with additional polarity switched portions of a bar magnet and longer slider switch trough.

Figure 7:
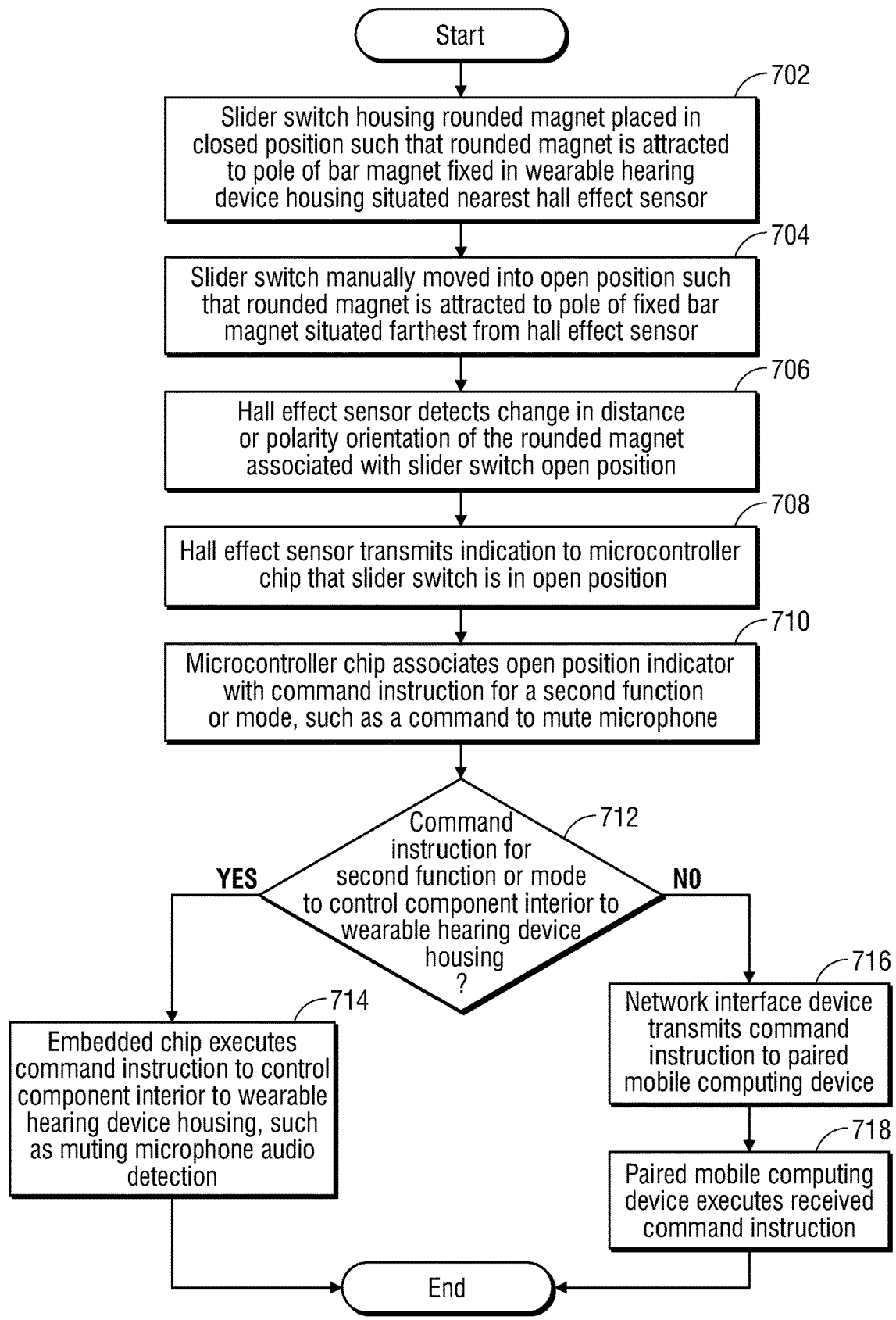
FIG. 7 is a flow diagram illustrating a method of executing a command instruction input prompted by movement of a magnetic slider switch according to an embodiment of the present disclosure.

FIG. 7 is a flow diagram illustrating a method of executing a command instruction input by a user via movement of a magnetic slider switch on a wearable hearing device according to an embodiment of the present disclosure. As described herein, the enhanced wearable hearing device command instruction manual input system in an embodiment may provide a magnetic slider switch within a sliding trough of an exterior surface of a wearable hearing device housing that decreases the amount of force the user must exert on the magnetic slider switch to move the magnetic slider switch from one physical switch position to another. The change in position of the magnetic slider switch in an embodiment may be easily distinguished by the user through touch, in order to provide continuing tactile feedback indicating a current operational setting (e.g., call muted mode) for the wearable hearing device. A hall effect sensor and a microcontroller chip or other integrated circuit within the wearable headset device in an embodiment may work together to associate the change in position of the magnetic slider switch with a command instruction for execution by a processor in a paired information handling system, or a microcontroller, other integrated circuit, or other component of the wearable hearing device.

At block 702, the magnetic slider switch housing rounded magnet may be placed in a closed configuration such that the rounded magnet is strongly attracted to the pole of a fixed bar magnet within the wearable hearing device housing situated nearest a hall effect sensor. For example, in an embodiment described with reference to FIG. 5A, depicting the exterior surface 581*a* of the magnetic slider switch 580 in a closed position or configuration, in which the leading edge (e.g., left-hand edge) of the exterior surface 581*a* of the magnetic slider switch 580 lies flush with the leading edge (e.g., left-hand edge) of the outer wearable hearing device housing 510*b*. While in the closed configuration, the second rounded magnet pole 524 (e.g., N) may be strongly attracted to the second bar magnet pole 522 (e.g., S), such that a user must apply sufficient exterior force to overcome this strong attraction in order to move the exterior surface 581*a* of the magnetic slider switch 580 with respect to the outer wearable hearing device housing 510*b*. The fixed bar magnet in an embodiment may have a fixed position with respect to the hall effect sensor 509, with the second bar magnet pole 522 located nearest the hall effect sensor 509.

The magnetic slider switch may be manually moved into an open position in an embodiment at block 704, such that the rounded magnet is strongly attracted to the pole of the fixed bar magnet situated farthest from the hall effect sensor. For example, as described with reference to FIG. 5C, a user may apply an external force to slide the magnetic slider switch 580 into an open configuration in which the leading edge (e.g., left-hand edge) of the exterior surface 581*a* of the magnetic slider switch 580 is moved beyond the leading edge (e.g., left-hand edge) of the outer wearable hearing device housing 510*b*, to leave a gap between the exterior surface 581*a* of the magnetic slider switch 580 and the outer wearable hearing device housing 510*a*. The user may be capable of determining that the magnetic slider switch 580 is placed in an open configuration by feeling either that the leading edges of the magnetic slider switch 580 and the outer wearable hearing device housing 510*b* are not flush with one another, or by sensing the gap between the exterior surface 581*a* of the magnetic slider switch 580 and the outer wearable hearing device housing 510*a*.

In an embodiment described with reference to FIG. 5B, such lateral movement of the magnetic slider switch 580 from the closed configuration into an open configuration may result in concurrent lateral movement of a rounded magnet housed within the magnetic slider switch 580. For example, the rounded magnet in an embodiment comprising a first rounded magnet pole 523 having a first polarity (e.g., S) and a second rounded magnet pole 524 (e.g., N) may be housed between the exterior portion 581*a* of the magnetic slider switch 580 and the interior portion 581*b* of the magnetic slider switch 580 such that the rounded magnet is capable of rotating freely with respect to the magnetic slider switch 580, but may move laterally with the magnetic slider switch 580. As the exterior portion 581*a* of the magnetic slider switch 580, the interior portion 581*b* of the magnetic slider switch 580, and the rounded magnet (e.g., 523 and 524) move laterally in such a way, the attraction between the second pole 524 (e.g., N) of the rounded magnet and the second pole 522 (e.g., S) of the fixed bar magnet may cause the rounded magnet to rotate with respect to the exterior surface 581*a* of the magnetic slider switch 580 and the interior surface 581*b* of the magnetic slider switch 580, as depicted in FIG. 5B (e.g., as compared to FIG. 5A). As the rounded magnet continues to rotate with further lateral movement, eventually the first pole 523 (e.g., S) of the rounded magnet will be increasingly attracted to the first pole 521 (e.g., N) of the fixed bar magnet. Once this occurs, the magnetic attraction between the first pole 521 of the fixed bar magnet and the first pole 523 of the rounded magnet may act to pull the rounded magnet (e.g., 523 and 524), and both the exterior and interior surfaces (e.g., 581*a* and 581*b* respectively) of the magnetic slider switch 580 into the open configuration. This magnetic-effect may decrease the amount of force the user must exert to move the magnetic slider switch into an open configuration, thus decreasing the chance that such an action may dislodge the earbud 534 from the user's ear canal.

At block 706, the hall effect sensor may detect the change in distance or polarity orientation to the rounded magnet indicating the magnetic slider switch position in an embodiment. For example, the hall effect sensor 509 may operate to sense a change in distance between the hall effect sensor 509 and the rounded magnet (e.g., 523 and 524) when lateral movement occurs to shift the magnetic slider switch 580 from the closed configuration to the open configuration, as described directly above with respect to blocks 702 and 704.

The hall effect sensor in an embodiment may transmit an indication to the microcontroller or other integrated circuit of the wearable hearing device in an embodiment that the magnetic slider switch is in an open configuration at block 708. For example, in an embodiment, the hall effect sensor 509 may transmit an indication that such movement has occurred to the microcontroller on the printed circuit board 550 via an electrically conductive connection 551. In another embodiment, the microcontroller may generate a command for on-board components of the wearable hearing device or may transmit the indication of the position movement to a processor at a paired information handling system via a wireless radio system on the printed circuit board 550.

At block 710, the microcontroller or other integrated circuit of the wearable hearing device may associate an open position indicator with a command instruction for a second function or mode for one or more components housed within the wearable hearing device in an embodiment or for application software executing on a paired information handling system in another embodiment. The command instruction and an association between that command instruction and one or more known configurations of the magnetic slider switch in an embodiment may be stored in memory of the wearable hearing device. For example, in an embodiment described with reference to FIG. 1, various command instructions and their associated magnetic slider switch configurations may be preset and stored in computer readable medium 152 within the microcontroller chip 150 of the wearable hearing device. Such instructions may be stored as software or firmware in various embodiments described herein. In another embodiment, the microcontroller or other integrated circuit of the wearable hearing device may transmit an open position indicator or an associated command to a paired information handling system for use by a processor 101, main memory 102, static memory 103, or drive unit 107 therein to command a function on the information handling system 100 such as for an operating software application.

Command instructions that may be associated with a particular configuration of the magnetic slider switch in an embodiment may include, for example, a command to mute a current call, to answer a current call, to end a current call, to increase or decrease volume, to initiate a voice assistance program, to fast forward or skip playback of an audio file or streaming audio (e.g., by ten seconds or thirty seconds), to rewind or skip back playback of an audio file or streaming audio (e.g., by ten seconds or thirty seconds), pause playback of an audio file or streaming audio, to terminate pairing with a paired information handling system, or any of several other functions or modes that may be invoked by a change from a closed position to an open position. The processor 101 on the paired information handling system or the microcontroller chip 150 on the wearable hearing device in various embodiments may receive an indication of a change in distance between the hall effect sensor 109 and a rounded magnet 120 housed within the magnetic slider switch, and associate that change in distance with a known configuration of the magnetic slider switch (e.g., open configuration, closed configuration, intermediate configuration). In an embodiment, the processor 101 or the microcontroller chip 150 may associate such a known configuration with a preset or pre-programmed command instruction (e.g., mute call, or terminate call). In further embodiments as described herein, multiple position may be detected by the hall effect sensor at block 708 and each of these detected distances of the magnetic slider switch may be separately associated with a second command for a third or later function or mode of the wearable hearing device. Further, detecting a change back from the open position to a closed position may invoke a third command for a new function or mode or return the wearable hearing device to the previous function or mode of the closed position. The magnetic slider switch may be programmed to function an any number of ways for commands to change functions or modes when position change is detected and with any number of detectable switch positions.

The microprocessor chip or other integrated circuit in the wearable hearing device in an embodiment may determine whether the command instruction identified at block 708 controls functionality of a component housed within the wearable hearing device or a component housed within the paired mobile information handling system computing device located remotely from the wearable hearing device at block 712. For example, referring to FIG. 1, command instructions in various embodiments described herein may be executable by the processor 101 on the paired, mobile information handling system or by the microcontroller chip 150 or by various other components housed within the wearable hearing device 100. More specifically, a command instruction to mute a call may require controlling functionality of the microphone 111 housed within the wearable hearing device 130. In contrast, a command instruction to terminate a call may require controlling functionality of the paired, mobile information handling system 100 that has initiated and established the call with a remote network (e.g., 170). If the command instruction requires controlling functionality of a component housed within the wearable hearing device, the method may proceed to block 714 for local execution of that command instruction. If the command instruction requires controlling functionality of a component housed outside the wearable hearing device, such as within a paired, mobile information handling system, the method may proceed to block 716 for transmission of that command instruction to the remote device.

At block 714, in an embodiment in which the command instruction identified at block 708 requires control of a component housed within the wearable hearing device, the microcontroller chip or other integrated circuit on the PCB of the wearable hearing device may execute the command instruction to control the local component. For example, referring to FIG. 1, the microcontroller chip 150 in an embodiment may execute an instruction to mute a call by switching off the audio sound detector or terminating power supply to the microphone 111. The call may remain muted in an embodiment until the user physically manipulates the magnetic slider switch into a different configuration (e.g., the closed configuration). Because the user can determine the current configuration of the magnetic slider switch through touch, as described in greater detail with respect to FIGS. 5A, 5B, and 5C, the enhanced wearable hearing device command instruction manual input system in an embodiment may provide tactile feedback indicating that the call remains muted based on the position of the magnetic slider switch as felt relative to the housing of the wearable hearing device. In such a way, the enhanced wearable hearing device command instruction manual input system may provide a switch that can be manipulated by the user without displacing the wearable hearing device from its intended position, for tactile feedback of a current setting for the wearable hearing device. The method for inputting a user command instruction for operation of a component housed within the wearable hearing device via a magnetic slider switch may then end.

In an embodiment in which the command instruction identified at block 708 requires control of a component located remotely from the wearable hearing device, the network interface device on the PCB of the wearable hearing device may transmit the command instruction to the wireless network interface of the paired, mobile information handling system computing device for remote execution at block 716. For example, the processor 101 of information handling system 100 may execute an instruction to terminate a call by receiving an instruction from the wearable hearing device wireless radio system 199 via wireless the network interface device 160 to terminate a wireless link supporting that call between the paired, mobile information handling system computing device 100 and a WWAN network (e.g., 170).

At block 718, the paired, mobile information handling system computing device in an embodiment may execute the received command instruction. For example, the paired mobile information handling system computing device 100 may execute the instruction to terminate the wireless link received from the wearable hearing device wireless radio system 199 at the wireless network interface device 160 at block 716, thus ending the call. The call may remain terminated, and no new calls may be initiated in an embodiment until the user physically manipulates the magnetic slider switch into a different configuration (e.g., the closed configuration). Because the user can determine the current configuration of the magnetic slider switch through touch, as described in greater detail with respect to FIGS. 5A, 5B, and 5C, the enhanced wearable hearing device command instruction manual input system in an embodiment may provide tactile feedback via the position of the magnetic slider switch relative to the wearable hearing device housing indicating that no calls are currently linked. In such a way, the enhanced wearable hearing device command instruction manual input system may provide a switch that can be manipulated by the user without displacing the wearable hearing device from its intended position, for tactile feedback of a current setting for the wearable hearing device. The method for inputting a command instruction for operation of a component located remotely, such as within a paired mobile information handling system computing device, via a magnetic slider switch may then end.

The blocks of the flow diagrams of FIG. 7 or steps and aspects of the operation of the embodiments herein and discussed herein need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another may communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The subject matter described herein is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. A wearable hearing device paired with an information handling system comprising:
   a wearable hearing device housing for a microphone and a speaker;
   a magnetic slider switch operatively coupled to and moveable with respect to the wearable hearing device housing between a closed position and an open position in response to an external force applied by a wearer as a user input;
   a rolling magnet mounted within the magnetic slider switch capable of rotation with respect to the magnetic slider switch during movement between the open position and the closed position;
   a bar magnet having a fixed position with respect to the wearable hearing device housing, a first pole attracting the rolling magnet when the magnetic slider switch is in the closed position, and a second pole attracting the rolling magnet when the magnetic slider switch is in the open position to reduce a magnitude of the external force required to move the magnetic slider switch between the open position and the closed position;

a hall effect sensor having a fixed position with respect to the bar magnet and the wearable hearing device housing to sense a first change in distance to the rolling magnet during movement of the rolling magnet and the magnetic slider switch between the open position and closed position, and to associate the first change in distance with a first command instruction; and a microcontroller to execute or transmit the first command instruction.

2. The wearable hearing device of claim 1 further comprising:

the wearable hearing device housing is an earbud enclosing the speaker for insertion within an ear canal of the wearer.

3. The wearable hearing device of claim 1 further comprising:

the wearable hearing device housing is a headphone enclosing the speaker for placement against an ear of the wearer.

4. The wearable hearing device of claim 1 further comprising:

the hall effect sensor to associate the first change in distance with an instruction to mute a current call; and the microcontroller to instruct a microphone housed within the wearable hearing device housing to cease detecting audio.

5. The wearable hearing device of claim 1 further comprising:

the hall effect sensor to associate the first change in distance with an instruction to answer an incoming call; and a wearable hearing device wireless radio system housed within the wearable hearing device housing to transmit a command to the paired information handling system to establish a wireless communication link for the incoming call.

6. The wearable hearing device of claim 1 further comprising:

a wearable hearing device wireless radio system to transmit the first command instruction for remote execution at the paired information handling system.

7. The wearable hearing device of claim 1 further comprising:

the magnetic slider switch moveable to an intermediate position between the closed position and the open position;

the bar magnet having a third pole attracting the rolling magnet when the magnetic slider switch is in the intermediate position to reduce the magnitude of the external force required to move the magnetic slider switch to the intermediate position;

the hall effect sensor to sense a second change in distance to the rolling magnet during movement of the rolling magnet and the magnetic slider switch to the intermediate position, and to associate the second change in distance with a second command instruction; and the microcontroller to execute or transmit the second command instruction.

8. A wearable earbud hearing device wirelessly paired to an information handling system comprising:

a wearable hearing device housing for a speaker and a microphone, including an earbud enclosing the speaker for insertion within an ear canal of a wearer;

a wearable hearing wireless radio system to establish a wireless communication link to pair with the paired information handling system;

a magnetic slider switch operatively coupled to and moveable with respect to the wearable hearing device housing between a closed position and an open position in response to an external force applied by a wearer as a user input;

a rolling magnet mounted within the magnetic slider switch capable of rotation with respect to the magnetic slider switch during movement between the open position and the closed position;

a bar magnet having a fixed position with respect to the wearable hearing device housing, a first pole attracting the rolling magnet when the magnetic slider switch is in the closed position, and a second pole attracting the rolling magnet when the magnetic slider switch is in the open position to reduce a magnitude of the external force required to move the magnetic slider switch between the open position and the closed position;

a hall effect sensor having a fixed position with respect to the bar magnet and the wearable hearing device housing to sense a first change in distance to the rolling magnet during movement of the rolling magnet and the magnetic slider switch between the open position and closed position, and to associate the first change in distance with a first command instruction; and a microcontroller to execute or transmit the first command instruction.

9. The wearable earbud hearing device of claim 8 further comprising:

the hall effect sensor to associate the first change in distance with an instruction to mute a current call; and the microcontroller to instruct the wearable hearing device wireless radio system within the wearable hearing device housing to cease transmitting audio via the established wireless communication link to the paired information handling system.

10. The wearable earbud hearing device of claim 8 further comprising:

the hall effect sensor to associate the first change in distance with an instruction to initiate a voice assistance application; and the microcontroller to communicate with the paired information handling system to execute a voice assistance application capable of receiving user input via the microphone within the wearable hearing device housing.

11. The wearable earbud hearing device of claim 8 further comprising:

the hall effect sensor to associate the first change in distance with an instruction to end a current call; and the wearable hearing device wireless radio system housed within the wearable hearing device housing transmit a command to terminate a call wireless communication link at the paired information handling system.

12. The wearable earbud hearing device of claim 8 further comprising:

the microcontroller to instruct wearable hearing device wireless radio system housed within the wearable hearing device housing to transmit, via a Bluetooth® wireless link, the first command instruction for remote execution at a software application executing at the paired information handling system.

13. The wearable earbud hearing device of claim 8 further comprising:

the microcontroller to instruct the wearable hearing device wireless radio system housed within the wearable hearing device housing to transmit, via a Wireless Local Area Network (WLAN) wireless link, the first command instruction for remote execution at a paired information handling system.

14. The wearable earbud hearing device of claim 8 further comprising:
the magnetic slider switch moveable to an intermediate position between the closed position and the open position;
the bar magnet having a third pole attracting the rolling magnet when the magnetic slider switch is in the intermediate position;
the hall effect sensor to sense a second change in distance to the rolling magnet during movement of the rolling magnet and the magnetic slider switch to the intermediate position, and to associate the second change in distance with a second command instruction.

15. A wearable hearing device operatively coupled to an information handling system comprising:
a wearable hearing device housing for a microphone and a speaker;
a wearable hearing wireless radio system to establish a wireless communication link to wirelessly couple with the information handling system;
a magnetic slider switch operatively coupled to and moveable with respect to the wearable hearing device housing between an open position, a closed position, and an intermediate position located between the open position and the closed position in response to an external force applied by a wearer as a user input;
a rolling magnet mounted within the magnetic slider switch capable of rotation with respect to the magnetic slider switch during movement between the open position, intermediate position, and the closed position;
a bar magnet having a fixed position with respect to the wearable hearing device housing, a first pole attracting the rolling magnet when the magnetic slider switch is in the closed position, a second pole attracting the rolling magnet when the magnetic slider switch is in the intermediate position, and a third pole attracting the rolling magnet when the magnetic slider switch is in the open position;
a hall effect sensor having a fixed position with respect to the bar magnet and the wearable hearing device housing, the hall effect sensor to sense a first change in distance to the rolling magnet during movement of the rolling magnet and the magnetic slider switch between the open position and the intermediate position, and to associate the first change in distance with a first command instruction;
the hall effect sensor to sense a second change in distance to the rolling magnet during movement of the rolling magnet and the magnetic slider switch between the intermediate position and the closed position, and to associate the second change in distance with a second command instruction; and
a microcontroller to execute or transmit the first command instruction and the second command instruction.

16. The information handling system of claim 15, wherein the first command instruction is a user input to increase volume output by the speaker by a fixed amount.

17. The information handling system of claim 15, wherein the second command instruction is a user input to decrease volume output by the speaker by a fixed amount.

18. The information handling system of claim 15, wherein the first command instruction is a user input to skip forward within an audio file output by the speaker.

19. The information handling system of claim 15, wherein the first command instruction is a user input to mute the microphone.

20. The information handling system of claim 15, wherein the second command instruction is an instruction to terminate a wireless link with the wirelessly coupled information handling system to unpair from the information handling system.

* * * * *